United States Patent
Tatum et al.

(10) Patent No.: US 9,318,639 B2
(45) Date of Patent: Apr. 19, 2016

(54) GALLIUM ARSENIDE AVALANCHE PHOTODIODE

(71) Applicant: FINISAR CORPORATION, Sunnyvale, CA (US)

(72) Inventors: James A. Tatum, Plano, TX (US); James R. Biard, Richardson, TX (US)

(73) Assignee: FINISAR CORPORATION, Sunnyvale, CA (US)

( * ) Notice: Subject to any disclaimer, the term of this patent is extended or adjusted under 35 U.S.C. 154(b) by 0 days.

(21) Appl. No.: 14/488,038

(22) Filed: Sep. 16, 2014

(65) Prior Publication Data

US 2015/0076647 A1  Mar. 19, 2015

Related U.S. Application Data

(60) Provisional application No. 61/878,699, filed on Sep. 17, 2013.

(51) Int. Cl.
| | | |
|---|---|---|
| *H01L 31/107* | (2006.01) | |
| *H01L 31/0232* | (2014.01) | |
| *H01L 31/0304* | (2006.01) | |
| *H01L 31/0264* | (2006.01) | |

(52) U.S. Cl.
CPC .......... *H01L 31/107* (2013.01); *H01L 31/0232* (2013.01); *H01L 31/0264* (2013.01); *H01L 31/0304* (2013.01)

(58) Field of Classification Search
CPC ............ H01L 31/107; H01L 31/0232; H01L 31/0304; H01L 31/0264
USPC ........................................................ 257/438
See application file for complete search history.

(56) References Cited

U.S. PATENT DOCUMENTS

| 5,308,995 | A | * | 5/1994 | Tsuji et al. ................. 257/17 |
| 5,569,942 | A | * | 10/1996 | Kusakabe ................. 257/186 |
| 2007/0267653 | A1 | * | 11/2007 | Yoneda et al. ............. 257/186 |
| 2008/0237452 | A1 | * | 10/2008 | Yoneda et al. ........... 250/214 R |
| 2011/0169117 | A1 | * | 7/2011 | McIntosh et al. .......... 257/432 |

* cited by examiner

*Primary Examiner* — Trung Q Dang
(74) *Attorney, Agent, or Firm* — Maschoff Brennan

(57) ABSTRACT

An avalanche photodiode can include: an avalanche region having one or more layers prepared from GaAs; an N⁻ absorption layer extending across the avalanche region; an N-type layer above at least a center portion of the N⁻ absorption layer; and optionally a lower conductivity layer laterally from the N-type layer to a surface of the avalanche region and above a perimeter portion of the N⁻ absorption layer, the lower conductivity layer having lower conductivity compared to the N-type layer. The avalanche photodiode can include a window layer above the N-type layer and lower conductivity layer, and an anode contact above the window layer. The avalanche photodiode can include an N⁺ barrier layer below the N⁻ absorption layer, an N⁺ conduction layer below the N⁺ barrier layer, a substrate below the N⁺ conduction layer, and a cathode contact coupled with the N⁺ conduction layer.

21 Claims, 12 Drawing Sheets

GALLIUM ARSENIDE AVALANCHE PHOTODIODE

CROSS-REFERENCE

This U.S. patent application claims the benefit of U.S. provisional patent application having Ser. No. 61/878,699 filed Sep. 17, 2013, which provisional application is incorporated herein by specific reference in its entirety.

BACKGROUND

Communication modules, such as electronic or optoelectronic transceivers or transponder modules, are used in electronic and optoelectronic communication. Such communication modules may include multiple components that operate at various voltages. An example of such a component is an optical receiver that converts an optical signal (incident light) into an electrical signal or voltage using, for example, a photodetector. A photodiode or photodiode array may be used as the photodetector to generate the electrical signal from the incident light. The communication module may also include an electrical circuit to receive and process the electrical signal from the photodetector to suit the desired application.

One very sensitive type of photodiode is an avalanche photodiode. Avalanche photodiodes are well-known devices that serve at least two functions: 1) conversion of optical signals into electrical signals; and 2) amplification of the electrical signal through avalanche multiplication. Typically, an avalanche photodiode has an absorption layer where an optical signal is absorbed. Photons in the optical signal impinging the absorption layer generate an electron-hole pair or a carrier pair. A multiplication layer in the avalanche photodiode is designed such that one carrier causes an avalanche of other carriers where the number of other carriers is dependent on the gain of the avalanche photodiode.

The subject matter claimed herein is not limited to embodiments that solve any disadvantages or that operate only in environments such as those described above. Rather, this background is only provided to illustrate one example technology area where some embodiments described herein may be practiced.

SUMMARY

In one embodiment, an avalanche photodiode can include: an avalanche region having one or more layers prepared from GaAs. The avalanche photodiode can include: an $N^-$ absorption layer extending across the avalanche region; an N-type layer above at least a center portion of the $N^-$ absorption layer; and optionally a lower conductivity layer laterally from the N-type layer to a surface of the avalanche region and above a perimeter portion of the $N^-$ absorption layer, wherein the lower conductivity layer has lower conductivity compared to the N-type layer. In one aspect, when included, the lower conductivity layer can have a conductivity reducing implant compared to conductivity of the N-type layer. In one aspect, the implant is a proton implant or a beryllium implant.

In one embodiment, the avalanche photodiode can include: an $N^-$ absorption layer extending across the avalanche region; and an N-type layer above the $N^-$ absorption layer and extending across the avalanche region.

In one embodiment, the avalanche photodiode can include: a $N^-$ absorption layer extending all the way across a mesa of the avalanche region so that the edges of the $N^-$ absorption layer form part of the sloped side wall of the mesa; and a N-type layer above the $N^-$ absorption layer extending all the way across the mesa of the avalanche region so that the edges of the N-type layer form part of the sloped side wall of the mesa. Accordingly, the N-type layer may not have any material or region laterally thereof in the mesa.

In one embodiment, the avalanche photodiode can include a transparent P-type window layer above the N-type layer and lower conductivity layer, and an anode contact above the window layer.

In one embodiment, the avalanche photodiode can include: a transparent $N^+$ barrier layer below the $N^-$ absorption layer, an $N^+$ conduction layer below the $N^+$ barrier layer, a substrate below the $N^+$ conduction layer, and a cathode contact coupled with the $N^+$ conduction layer. Here, orientation includes the top receiving the light and the bottom being the substrate.

In one embodiment, the avalanche region is included in a mesa structure, the mesa extending into the $N^+$ conduction layer so that a portion of the $N^+$ conduction layer is in the mesa and a portion forms a shoulder from the mesa, and with the cathode contact on the shoulder of the $N^+$ conduction layer.

In one embodiment, the avalanche photodiode can include: an oxide layer above the window layer; a dielectric passivation layer coated onto the window layer and over side surfaces of the mesa; an anode bond pad coupled with the anode contact; a cathode bond pad coupled with the cathode contact; and an environmental-protection passivation layer above the dielectric passivation layer, anode contact, and cathode contact, and with the environmental-protection passivation layer having openings that expose the anode bond pad and cathode bond pad.

In one embodiment, the windows (e.g., $P^+$ window layers) and blocking layers (e.g., $N^+$ barrier layers) of the APD can be transparent, such as being transparent to the intended wavelength of operation of the APD.

In one embodiment, an active thickness of the APD can include the GaAs layers between the window layer (e.g., $P^+$ window layer) and the blocking layer (e.g., $N^+$ barrier layer). The active thickness can be fully depleted at the operating avalanche voltage.

In one embodiment, an avalanche photodiode can include: an avalanche region having one or more layers prepared from GaAs. The avalanche photodiode can include: a $N^-$ absorption layer extending across the avalanche region; a N-type layer above a center portion of the $N^-$ absorption layer; and a lower conductivity layer laterally from the N-type layer to a surface of the avalanche region and above a perimeter portion of the $N^-$ absorption layer, the lower conductivity layer having lower conductivity compared to the N-type layer. The avalanche photodiode can include a transparent P-type window layer above the N-type layer and above the $N^-$ absorption layer, the window layer including the lower conductivity layer, and an anode contact above the window layer. The avalanche photodiode can include a transparent $N^+$ barrier layer below the $N^-$ absorption layer, an $N^+$ conduction layer below the $N^+$ barrier layer, a substrate below the $N^+$ conduction layer, and a cathode contact coupled with the $N^+$ conduction layer. The avalanche photodiode can include an avalanche region that is included in a mesa structure, the mesa extending into the $N^+$ conduction layer so that a portion of the $N^+$ conduction layer is in the mesa and a portion forms a shoulder from the mesa, with the cathode contact on the shoulder of the $N^+$ conduction layer. In one aspect, the avalanche photodiode can include: an oxide layer above the window layer; a dielectric passivation layer coated onto the window layer and over side surfaces of the mesa; an anode bond pad coupled with the anode contact; a cathode bond pad coupled with the cathode contact; and an environmental-protection passivation layer above the dielectric passivation layer, anode contact, and cathode contact, and the environmental-protection passivation layer having openings that expose the anode bond pad and cathode bond pad.

In one embodiment, an avalanche photodiode can include: an avalanche region having one or more layers prepared from GaAs; a $P^-$ absorption layer extending across the avalanche region; a P-type layer below a center portion of the $P^-$ absorption layer; and a lower conductivity region laterally from the P-type layer to a surface of the avalanche region and below a perimeter portion of the $P^-$ absorption layer, the lower conductivity region having lower conductivity compared to the P-type layer. In one aspect, the avalanche photodiode can include a transparent P-type window layer above the $P^-$ absorption layer, the $P^-$ absorption layer including the lower conductivity region, and an anode contact above the window layer. In one aspect, the avalanche photodiode can include a transparent $N^+$ barrier layer below the $P^-$ absorption layer, an $N^+$ conduction layer below the $N^+$ barrier layer, a substrate below the $N^+$ conduction layer, and a cathode contact coupled with the $N^+$ conduction layer. In one aspect, the avalanche region is included in a mesa structure, the mesa extending into the $N^+$ conduction layer so that a portion of the $N^+$ conduction layer is in the mesa and a portion forms a shoulder from the mesa, with the cathode contact on the shoulder of the $N^+$ conduction layer. In one aspect, the avalanche photodiode can include: an oxide layer above the window layer; a dielectric passivation layer coated onto the window layer and over side surfaces of the mesa; an anode bond pad coupled with the anode contact; a cathode bond pad coupled with the cathode contact; and an environmental-protection passivation layer above the dielectric passivation layer, anode contact, and cathode contact, and the environmental-protection passivation layer having openings that expose the anode bond pad and cathode bond pad.

In one embodiment, a method of manufacturing an avalanche photodiode can include: growing a base epitaxial structure having a substrate, a conduction layer above the substrate, a barrier layer above the conduction layer, an absorption layer above the barrier layer, and an active layer (e.g., N-type layer GaAs) above the absorption layer, the absorption layer and active layer having GaAs with different doping; processing the active layer to remove an annular perimeter region to leave a center active region; and growing a window layer over the center active region of the active layer and over the absorption layer. In one aspect, the active layer produced by this method is an N-type active layer.

In one embodiment, a method of manufacturing an avalanche photodiode can include: growing a base epitaxial structure having a substrate, a conduction layer above the substrate, a barrier layer above the conduction layer, an absorption layer above the barrier layer, and an active layer (e.g., N-type layer GaAs) above the absorption layer, the absorption layer and active layer having GaAs with different doping; and growing a window layer over the active layer and over the absorption layer. In one aspect, the active layer produced by this method is an N-type active layer.

In one embodiment, a method of manufacturing an avalanche photodiode can include: growing a base epitaxial structure having a substrate, a conduction layer above the substrate, a barrier layer above the conduction layer, an active layer (e.g., P-type layer $P^+$ GaAs) above the barrier layer where the active layer is etched at the annular perimeter region to leave a central region, and an absorption layer (e.g., $P^-$ absorption layer) above the barrier layer at the annular perimeter region where the active layer was etched away; and growing a window layer over the center active region of the active layer and over the absorption layer. In one aspect, the active layer is a P-type active layer.

In one embodiment, a method of manufacturing an avalanche photodiode can include: growing a base epitaxial structure having a substrate, a conduction layer above the substrate, a barrier layer above the conduction layer, an active layer (e.g., P-type layer $P^+$ GaAs) above the barrier layer, and an absorption layer (e.g., $P^-$ absorption layer) above the barrier layer; and growing a window layer over the center active region of the active layer and over the absorption layer. In one aspect, the active layer is a P-type active layer.

In one embodiment, when the active layers are N-type, the $N^-$ portion of the active thickness can be adjacent to the $N^+$ blocking layer, and the higher conductivity N-type portion of the active thickness can be adjacent to the $P^+$ window layer.

In one embodiment, when the active thickness is P-type, the $P^-$ portion of the active thickness can be adjacent to the $P^+$ window layer, and the higher conductivity P-type portion of the active thickness can be adjacent to the $N^+$ barrier layer.

In one embodiment, the method includes forming the window layer to have a center stepped-up region above the center active region of the active layer compared to a perimeter stepped-down region above the absorption layer, wherein the center stepped-up region and perimeter stepped-down region includes about the same thickness of material.

In one embodiment, a method of manufacturing an avalanche photodiode can include: growing a base epitaxial structure having a substrate, a conduction layer above the substrate, a barrier layer above the substrate, an absorption layer above the substrate, and an active layer above the absorption layer, absorption layer, and active layer having GaAs with different doping; processing the active layer with implantation to reduce conductivity of an annular perimeter region to leave a center active region; and growing a window layer over the center active region of the active layer and over the absorption layer. In one aspect, the implantation is proton or beryllium implantation.

In one embodiment, any of the manufacture methods can include the following: forming an oxide layer over the window layer; etching the base epitaxial structure to form a mesa structure; depositing a dielectric passivation layer over the mesa; etching the dielectric passivation layer to form an anode contact area and a cathode contact area; forming an anode contact in the anode contact area; forming a cathode in the cathode contact area; forming an anode bond pad that is electronically coupled with the anode contact area; forming a cathode bond pad that is electronically coupled with the cathode contact area; depositing an environmental-protection passivation layer; and removing portions of the environmental-protection passivation layer to expose the anode bond pad and cathode bond pad.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE FIGURES

The foregoing and following information as well as other features of this disclosure will become more fully apparent from the following description and appended claims, taken in conjunction with the accompanying drawings. Understanding that these drawings depict only several embodiments in accordance with the disclosure and are, therefore, not to be considered limiting of its scope, the disclosure will be described with additional specificity and detail through use of the accompanying drawings.

DETAILED DESCRIPTION

Figure 1:
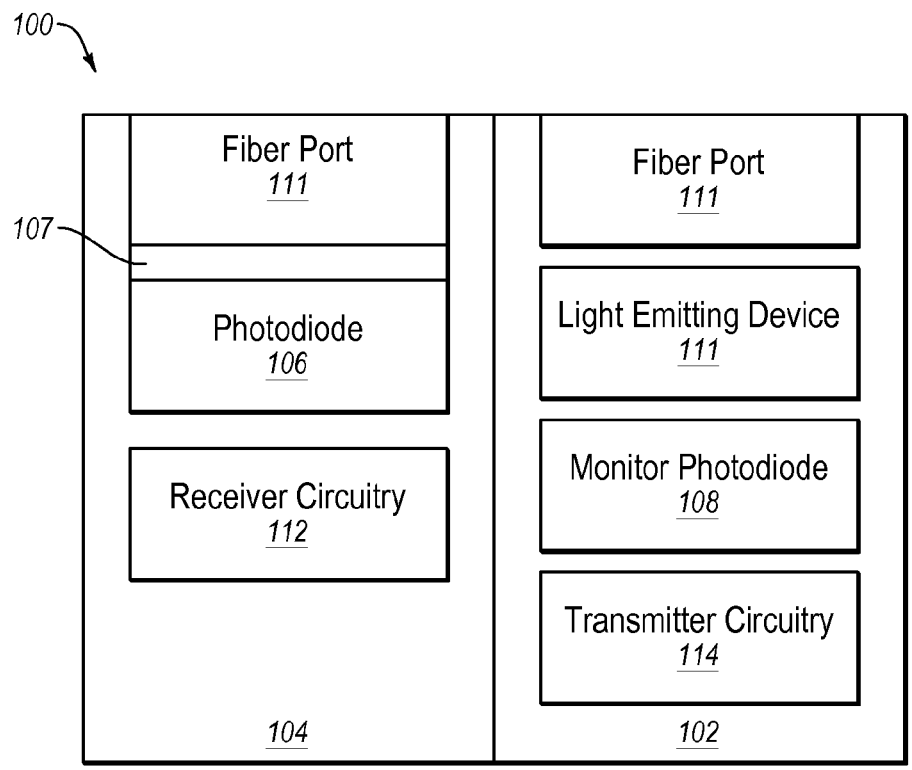
FIG. 1 includes an illustration of a transceiver.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein, and illustrated in the figures, can be arranged, substituted, combined, separated, and designed in a wide variety of different configurations, all of which are explicitly contemplated herein.

The terms and words used in the following description and claims are not limited to the bibliographical meanings, but are merely used to enable a clear and consistent understanding of the disclosure. It is to be understood that the singular forms "a," "an," and "the" include plural referents unless the context clearly dictates otherwise. Thus, for example, reference to "a component surface" includes reference to one or more of such surfaces.

By the term "substantially" it is meant that the recited characteristic, parameter, or value need not be achieved exactly, but that deviations or variations, including for example, tolerances, measurement error, measurement accuracy limitations and other factors known to those skilled in the art, may occur in amounts that do not preclude the effect the characteristic was intended to provide.

In this disclosure the term "optoelectronic subassembly" may be used to refer to any portion of an optoelectronic assembly. However, at times this disclosure may use "optoelectronic subassembly" to refer to specific portions of an optoelectronic assembly, as may be indicated by context.

High-speed fiber optic networks use light signals (which may also be referred to as optical signals) to transmit data over a network. Fiber optic networks have various advantages over other types of networks such as copper wire based networks. Many existing copper wire networks operate at near maximum possible data transmission rates and at near maximum possible distances for copper wire technology. Fiber optic networks are able to reliably transmit data at higher rates over further distances than is possible with copper wire networks.

Although fiber optic networks use light signals to carry data, many electronic devices such as computers and other network devices use electrical signals. Accordingly, optoelectronic assemblies may be used to convert electrical signals to optical signals, convert optical signals to electrical signals, or convert both electrical signals to optical signals and optical signals to electrical signals.

Optoelectronic assemblies may include optoelectronic subassemblies ("OSAs"), such as receiver optoelectronic subassemblies ("ROSAs"), transmitter optoelectronic subassemblies ("TOSAs"), or both. A ROSA receives light signals with a light detector such as a photodiode and converts light signals into electrical signals. A TOSA receives electrical signals and transmits corresponding light signals. A TOSA may include an optical transmitter such as a laser that generates light that is transmitted to a fiber optic network. Optoelectronic assemblies or subassemblies may include various components such as optical components and/or electronic components.

Some optoelectronic assemblies may include multiple channels ("multi-channel optoelectronic assemblies"), with each channel corresponding to a set of one or more optical signals travelling through an optical fiber. Multi-channel optoelectronic assemblies may support increased data transfer rates through fiber optic networks. For example, a four channel optoelectronic assembly may be able to send and receive data at data transfer rates of approximately four times the data transfer rate of a comparable single channel optoelectronic assembly.

Ferrule assemblies may be used in fiber optic networks, such as at fiber ports, to physically and/or optically couple optical fibers with optoelectronic assemblies, optoelectronic subassemblies, optical components, and/or electronic components. For example, ferrule assemblies may be used to couple ROSAs and/or TOSAs to optical fibers that are part of a fiber optic network thereby permitting the ROSA to receive optical signals and/or permitting the TOSA to transmit optical signals. Additionally or alternatively, ferrule assemblies may form part of an optoelectronic assembly or subassembly configured to transmit or receive electrical or optical signals in a fiber optic network.

Optoelectronic assemblies may need to comply with certain standards that may specify aspects of optoelectronic assemblies such as size, power handling, component interfaces, operating wavelengths, or other specifications. Examples of such standards include CFP, XAUI, QSFP, QSFP+, XFP, SFP, and GBIC. Complying with such standards may limit the structure, size, cost, performance, or other aspects of optoelectronic assembly designs. Such standards may also limit configurations of components of optoelectronic assemblies such as receptacles that receive ferrule assemblies and/or hermetic sealing structures such as housings.

Generally, the present technology is related to avalanche photodiodes that include gallium arsenide (GaAs) in the active region as well as optoelectronic assemblies or subassemblies and ROSAs having the photodiodes. The avalanche photodiodes can be used in 10G and 14G SR transceivers, as well as others. The avalanche photodiodes can be used in receivers and transceivers. The avalanche photodiodes can boost receiver sensitivity by boosting photodiode responsivity via the GaAs.

FIG. 1 illustrates a transceiver 100 having a transmitter 102 and a receiver 104 as is common in transceiver communication modules. The receiver 104 can include a photodiode 106. An avalanche photodiode 106 can be configured as any embodiment of an avalanche photodiode described herein. Also, in some embodiments the transmitter 102 may include a monitor photodiode 108 to monitor light output from a light-emitting device 110, where the monitor photodiode 108 may be configured as an avalanche photodiode in accordance with one of the embodiments described herein. The receiver 104 can include receiver circuitry 112 that can operate with the photodiode 106 as well as other components common in receivers 104. The transmitter 102 can include transmitter circuitry 114 that can operate with the light-emitting device 110 and/or the monitor photodiode 108 as well as other components common in transmitters 102. All components of the transmitter 102 and/or the receiver 104 of the transceiver 100 can be operably coupled together as generally known and employed in the art. Additionally, the transmitter 102 and the receiver 104 can each include a fiber port 111 to receive an optical fiber. The receiver 104 can include the photodiode 106 having an anti-reflection layer 107 on the entrance that receives light from the fiber port 111. The anti-reflection layer 107 can be a dielectric layer on the surface of the photodiode 106, and it can be configured to inhibit or minimize front surface reflection so that light is not reflected back into the fiber and transmitted back to the light emitter (e.g., laser diode, VCSEL, etc.) that is transmitting light to the photodiode 106.

Figure 1A:
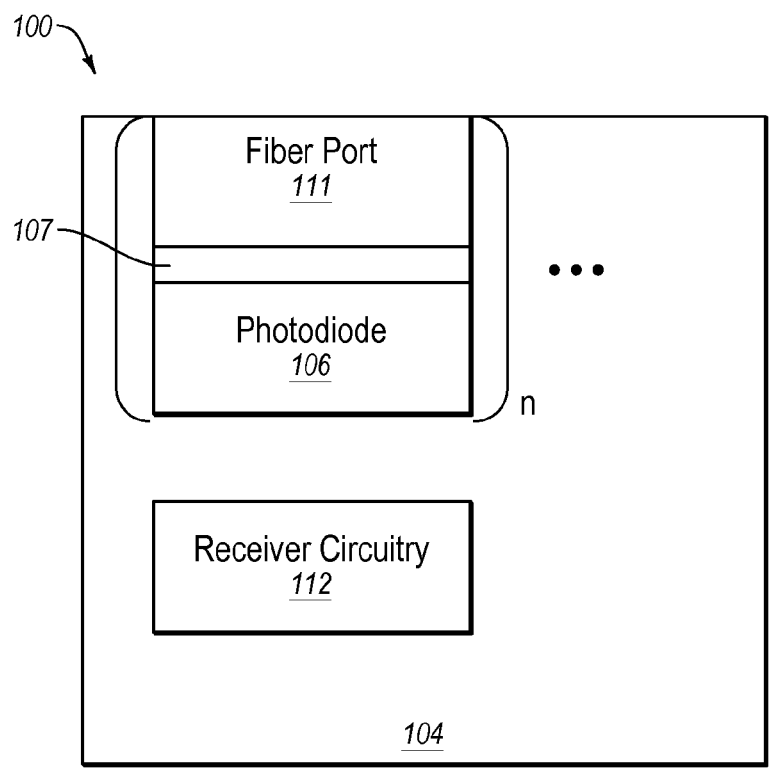
FIG. 1A includes an illustration of a receiver having an array of photodiodes.

Additionally, the photodiode of the invention can be used alone in a receiver for receiving optical communication signals. That is, a receiver can include a single photodiode, which can be used with one channel. Also, a receiver can include multiple channels each with an optical fiber optically coupled with a photodiode. Each channel can include its own optical fiber and photodiode. The optical fibers and photodiodes can be arranged in parallel. FIG. 1A shows the receiver 104 having "n" photodiodes 106 (e.g., along with fiber ports 111 and the anti-reflection layer 107) being an integer, such as 1, 2, 3, 4, 5, 6, 7, 8, 9, 10, or higher. That is, the receiver 104 can include any number of photodiodes 106 as described herein.

Figure 2:
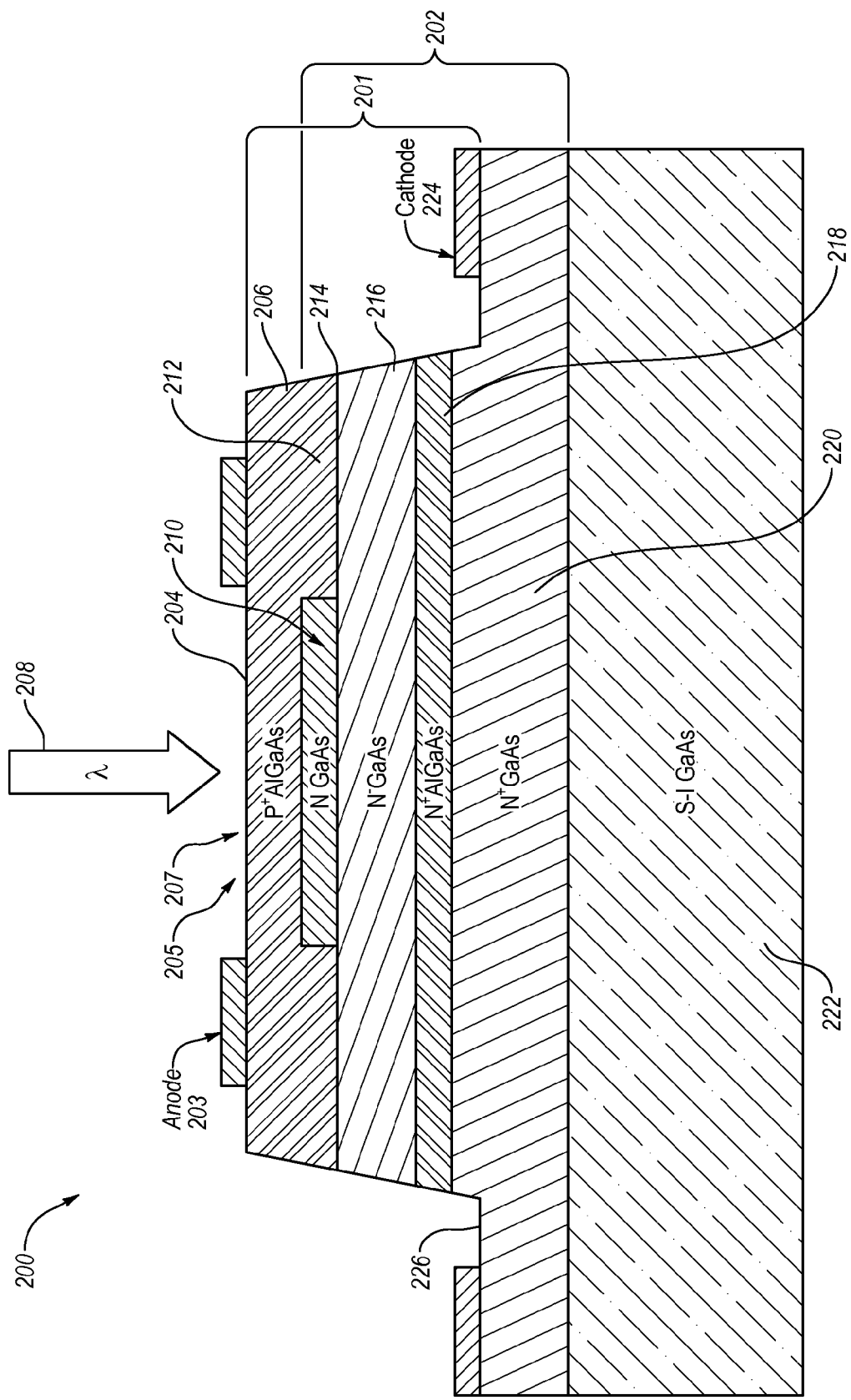
FIG. 2 includes an illustration of an embodiment of an avalanche photodiode with an N-type active region formed by an interrupted growth process.

FIG. 2 illustrates an embodiment of a photodiode 200 configured as an avalanche photodiode (APD). The photodiode 200 can include a mesa region 201. The APD 200 can include an avalanche region 202 that is close to an optical entrance surface 204 of a window layer 206. The window layer 206 and at least a portion of the avalanche region 202 can be included in the mesa region 201. The window layer 206 can include an anode 203, which can be an annular anode as shown. The annular anode 203 can define an optical aperture 205 by an aperture 207 of the annular anode 203. The optical aperture 205 extends longitudinally with respect to a longitudinal axis (e.g., parallel to the longitudinal axis) of the aperture 207 of the annular anode 203. The sides of the optical aperture 205 can be defined by the sides of the annular anode 203 that define the aperture 207.

The window layer 206 can have a thickness of about 0.5 microns to about 1.5 microns, from about 0.7 microns to about 1.2 microns, or from about 0.85 microns to about 1.0 micron. The width of the window layer 206 can be about 36 microns to about 116 microns, from about 46 microns to about 96 microns, or from about 56 microns to about 76 microns. Depending on the wavelength of the APD 200, the window layer 206 thickness can affect the responsivity of the APD 200. For 850 nm, the optimum window layer thickness can be about 0.852 microns. For any given APD design it can be desirable to keep the area of the window layer 206 after mesa etch to a minimum to realize the minimum junction capacitance for the active area of that particular design. These parameters can be used in any embodiment of the avalanche photodiode described herein.

The annular anode 203 metal contact can have a thickness of about 0.5 microns to about 1.5 microns, from about 0.6 microns to about 1.4 microns, or from about 0.7 microns to about 1.2 microns. The outer dimension of the annular anode 203 can be about 30 microns to about 110 microns, from about 40 microns to about 90 microns, or from about 50 microns to about 70 microns. The dimension of the aperture 207 of the annular anode 203 metal contact can be about 20 microns to about 100 microns, from about 30 microns to about 80 microns, or from about 40 microns to about 60 microns. The anode metal thickness can be modulated. In one aspect, the same anode metal can be on both VCSELs and photodiodes. A wide variety of anode metal thickness values can be used with equal performance. In one aspect, a minimum anode contact opening width of 3.0 microns can be beneficial. In one aspect, the anode metal can be about 1.0 micron larger than the anode contact opening (e.g., the aperture 207) to allow for alignment errors. This means that the minimum width of the anode metal can be 5.0 microns. The outer dimension of the anode metal is the aperture 207 dimension plus an additional 5.0 microns. That is, the distance from outer edge to inner edge is about 5 microns. In one aspect, the annular anode 203 is annular; however, the annular anode 203 can be a partial aperture, "C" shaped, or arc, and thereby the annular anode 203 does not have to go all the way around the active area of the optical aperture 205, which helps to achieve a minimum junction capacitance. These parameters can be used in any embodiment of the avalanche photodiode described herein.

The avalanche region 202 can be a GaAs avalanche region 202 and can be close to the optical entrance at the optical entrance surface 204 because of low hole mobility of GaAs materials to preserve the optical bandwidth (BW) of the APD 200.

In an example of receiving about 850 nm light to the optical entrance surface 204, the window layer 206 can be a $P^+$ AlGaAs material. Also, the window layer 206 can be about 0.852 microns thick, or +/−1%, 2%, 5%, 10%, 15%, or 20% thereof. These parameters can be used in any embodiment of the avalanche photodiode described herein.

In one example, the window layer 206 can include an $Al_{0.15}Ga_{0.85}As$ P-type window layer. However, the mole fractions can vary between $Al_{0.12}Ga_{088}As$ to $Al_{0.4}Ga_{06}$, or between $Al_{0.13}Ga_{0.87}As$ to $Al_{0.35}Ga_{0.65}$, or between $Al_{0.15}Ga_{0.85}As$ to $Al_{0.3}Ga_{0.7}$. In one aspect, the window layer 206 can be transparent or substantially transparent to the wavelength of the light for a particular APD 200. If too much Al is used in the AlGaAs of the window layer 206, the hole mobility can be reduced and the series resistance can increase. For each wavelength there is an optimum window layer composition, which can be designed as desired. These parameters can be used in any embodiment of the avalanche photodiode described herein.

The avalanche region 202 is adjacent or contacting a surface of the window layer 206 that is opposite of the optical entrance surface 204. The optical entrance surface 204 receives light 208 that passes through the window layer 206 and into the avalanche region 202. The avalanche region 202 includes an N-type layer 210 below and optionally directly adjacent with and optionally in contact with the window layer 206 opposite of the optical entrance surface 204. The N-type layer 210 can be optionally patterned by use of: a) interrupted growth and mesa etch; b) proton implant; or c) Be implant. The N-type layer 210 can be prepared with moderately heavy doping (~$1.3 \times 10^{17}$ cm$^{-3}$) with silicon or other donor impurity.

Also, the N-type layer 210 can be dimensioned such that it is only present in the optical aperture 205. That is, the sides of the N-type layer 210 can be aligned with the sides of the optical aperture 205, and thereby be aligned with the sides of the annular anode 203 that define the aperture 207. The N-type layer 210 can be only present in the optical aperture 205 so that it does not extend laterally past the sides of the optical aperture (e.g., the N-type layer 210 is not below the body of the annular anode 203, but only below the aperture 207 of the annular anode 203). The N-type layer 210 can be prepared from GaAs that is N-doped. The N-type layer 210 can have a thickness of about 0.2 microns to about 0.4 microns, from about 0.3 microns to about 0.38 microns, or from about 0.35 microns to about 0.36 microns. The width of the N-type layer 210 after patterning can be about 20 microns to about 100 microns, from about 30 microns to about 80 microns, or from about 40 microns to about 60 microns. However, it may not be patterned and it may extend across the entire mesa. The N-type 210 layer can be considered the active layer. These parameters can be used in any embodiment of the avalanche photodiode described herein.

When an EPI is grown, the N-type layer 210 can be deposited over the entire surface of the wafer (e.g., over an N$^-$ absorption layer 216). For performance in the APD 200, it can be desirable to have the N-type layer 210 only present in the active area. With the interrupted growth approach, the EPI process is stopped after the N-type layer 210 is deposited. The wafer is removed from the EPI reactor and patterned with photoresist to define the active area (e.g., the optical aperture 205) and the excess N-type material of the N-type layer 210 is etched away, and the etch is stopped on the N$^-$ absorption layer 216 below the N-type layer 210. Then the wafer is put back in the EPI reactor, and a conformal P-type window layer 206 is deposited on the wafer onto the exposed portion of the N$^-$ absorption layer 216 and the N-type layer 210. The resulting mesa defines the location of the active area (e.g., the optical aperture 205), and allows subsequent processes to be aligned to that active area structure. When the proton or Be implant is used, all the EPI layers including the P-type window layer 206 are grown in the EPI reactor over the entire surface of the wafer. Then the wafer is patterned with photoresist to protect the active area and the other parts of the wafer are implanted with protons or Be atoms at an appropriate energy to penetrate through the P-type window layer 206, and compensate the donor concentration in the N-type layer 210. With these approaches, the result is to increase the breakdown voltage of a higher breakdown voltage spacer region 212 around the active area so that the avalanche multiplication region is confined to the active area (e.g., the optical aperture 205). The thickness and doping level in the N-type layer 210 can be modulated and used to determine the breakdown voltage of the APD 200. In one aspect, an operating voltage of ~15 V can be beneficial; however, the value of the operating voltage can be anywhere between 12 V and 25 V for a useful APD 200.

The avalanche region 202 can optionally include the higher breakdown voltage spacer region 212 laterally from the N-type layer 210 to a mesa surface 214 of the mesa region 201. The higher breakdown voltage spacer region 212 can be a P$^+$—N$^-$—N$^+$ material with a higher breakdown voltage than the N-type layer 210. The higher breakdown voltage is accomplished by compensating the N-type layer 210 with either proton implant or Be implant. The higher breakdown voltage spacer region 212 can have a thickness of about the same as the N-type layer 210 or 0.2 microns to about 0.4 microns, from about 0.3 microns to about 0.38 microns, or from about 0.35 microns to about 0.36 microns. The width of the higher breakdown voltage spacer region 212 can be about 7.0 microns to about 9.0 microns, from about 7.5 microns to about 8.5 microns, or from about 7.9 microns to about 8.1 microns. The width of the higher breakdown voltage spacer region 212 can be determined by the diameter of the active area, and the buildup of dimensions required by the anode contact and the sloped mesa etch. In one aspect, the junction area can be kept to a minimum to minimize junction capacitance while keeping the depletion region at the operating voltage from reaching the mesa surface 214. In one example, avalanche happens at about 740 kV/cm. For a 15 V breakdown a 0.2-micron depletion width may be suitable. However, the higher breakdown voltage spacer region 212 can be omitted, and the N-type layer 210 can extend across the entire mesa from surface to surface.

The avalanche region 202 can include the N$^-$ absorption layer 216 that is below and optionally directly adjacent with and optionally in contact with the N-type layer 210. When the higher breakdown voltage spacer region 212 is included, the N$^-$ absorption layer 216 is below and optionally directly adjacent with and optionally in contact with the higher breakdown voltage spacer region 212. As such, the N$^-$ absorption layer 216 can extend across the mesa region 201 to the mesa surface 214, and thereby be under both the N-type layer 210 and the higher breakdown voltage spacer region 212. The N$^-$ absorption layer 216 can be GaAs. The N$^-$ absorption layer 216 can be distinguished from the N-type layer 210 by the lower donor concentration of <$1.174 \times 10^{15}$ cm$^{-3}$. Input photons are absorbed in both the N-type layer 210 and the N$^-$ absorption layer 216. The total thickness of the N-type layer 210 and the N$^-$ absorption layer 216 determines the responsivity, avalanche voltage, and the bandwidth of the APD 200. For a total thickness of the N-type layer 210 plus the N$^-$ absorption layer 216 of 3.0 microns, the bandwidth can be about 10 GHz with responsivity of 0.64 mA/mW; for a total thickness of 2.1 microns the bandwidth can be about 14 GHz with responsivity of 0.58 mA/mW; for a total thickness of 1.2 microns the bandwidth can be about 28 GHz with responsivity of 0.4 mA/mW. All of these APD configurations can have an avalanche voltage of 12 V to 25 V by adjusting the thickness and doping of the N-type layer 210. These parameters can be used in any embodiment of the avalanche photodiode described herein.

An N+ barrier layer 218 is below and optionally directly adjacent with and optionally in contact with the N− absorption layer 216. As such, the N+ barrier layer 218 can extend across the mesa region 201 to the mesa surface 214, and thereby be under the N− absorption layer 216. The N+ barrier layer 218 can be N+ AlGaAs. The N+ barrier layer 218 can be N-doped. The N+ barrier layer 218 can have AlGaAs as $Al_{0.15}Ga_{0.85}As$. However, the mole fractions of the N+ barrier layer 218 can vary between $Al_{0.12}Ga_{0.88}As$ to $Al_{0.13}Ga_{0.87}$, or between $Al_{0.35}Ga_{0.65}As$ to $Al_{0.15}Ga_{0.85}$, or between $Al_{0.15}Ga_{0.85}As$ to $Al_{0.3}Ga_{0.7}As$. The N+ barrier layer 218 can have a thickness of about 0.25 microns to about 0.5 microns, from about 0.3 microns to about 0.4 microns, or from about 0.32 microns to about 0.35 microns, or about 0.32 microns. The width of the N+ barrier layer 218 can be about 40 microns to about 120 microns, from about 50 microns to about 100 microns, or from about 60 microns to about 80 microns. The N+ barrier layer 218 can be transparent to the design wavelength of the APD 200. Typically, the N+ barrier layer 218 can have the same Al/Ga ratio as the window layer 206. The N+ barrier layer 218 can serve to block any holes optically generated in an N+ conduction layer 220 from contributing to the APD response. Holes generated in the N+ conduction layer 220 may limit the bandwidth of the APD and should be excluded. These parameters can be used in any embodiment of the avalanche photodiode described herein.

The N+ conduction layer 220 is below and optionally directly adjacent with and optionally in contact with the N+ barrier layer 218. The N+ conduction layer 220 can have a top portion that is part of the mesa region 201 and a bottom portion that is not part of the mesa region 201 (e.g., extend onto a solder region 226). The mesa etch normally extends about 1.0 micron into the N+ conduction layer 220. As such, the N+ conduction layer 220 can have a top portion that extends across the mesa region 201 to the mesa surface 214, and thereby be under the N+ barrier layer 218, and a bottom portion that extends laterally outward past the mesa surface 214 of the mesa region 201. The N+ conduction layer 220 can be N+ GaAs. The N+ conduction layer 220 can be N-doped. The N+ conduction layer 220 can have a top portion with a thickness of about 0.7 microns to about 1.2 microns, from about 0.85 microns to about 1.15 microns, or from about 0.95 microns to about 1.05 microns, or about 1.0 microns. The width of the top portion of the N+ conduction layer 220 can be about 40 microns to about 120 microns, from about 50 microns to about 100 microns, or from about 60 microns to about 80 microns. The N+ conduction layer 220 can have a bottom portion with a thickness of about 1.8 microns to about 2.2 microns, from about 1.9 microns to about 2.1 microns, or from about 1.95 microns to about 2.05 microns, or about 2 microns. The width of the bottom portion of the N+ conduction layer 220 extends to the edge of the chip after singulation by sawing. For a single APD die, the size is about square with dimensions of about 200 microns to about 250 microns, from about 210 microns to about 240 microns, or from about 212 microns to about 215 microns. For an array of APDs the length of the array will depend on the number of elements in the array; the width will always be the same. These parameters can be used in any embodiment of the avalanche photodiode described herein.

A substrate 222 is below and optionally directly adjacent with and optionally in contact with the N+ conduction layer 220. The substrate 222 can be an N-type GaAs substrate or a semi-insulating GaAs (S—I GaAs). An N-type GaAs substrate 222 can be N-doped. An S—I GaAs substrate 222 can be doped with a deep level impurity like Cr which pins the Fermi level near mid bandgap and results in a resistivity of $\sim 1.0 \times 10^7 \Omega$-cm. These parameters can be used in any embodiment of the avalanche photodiode described herein.

A cathode metal Ohmic contact 224, which can be an annular cathode or semicircle or arc or "C" shaped, can be located on the N+ conduction layer 220. The cathode metal Ohmic contact 224 can be on a surface of the N+ conduction layer 220 that is not part of the mesa region 201. As such, the N+ conduction layer 220 can have a top portion that is part of the mesa region 201 and a bottom portion that is not part of the mesa region 201, and such bottom portion can extend laterally from the mesa surface 214 and be referred to as the solder region 226. The cathode metal Ohmic contact 224 is deposited, patterned, and alloyed to form the cathode Ohmic contact. The cathode metal Ohmic contact 224 can have a thickness of about 0.2 microns to about 0.6 microns, from about 0.25 microns to about 0.5 microns, or from about 0.3 microns to about 0.33 microns. In one aspect, a minimum width of the cathode contact opening can be 6.0 microns and the cathode metal can be 1.5 microns larger than the contact opening to allow for alignment errors. This can result in a minimum anode metal width of 9.0 microns. The cathode metal Ohmic contact 224 can be annular, but it does not extend all the way around the mesa, and one example can be a typical N-contact arc. The cathode pad metal is deposited over the cathode metal Ohmic contact 224. The cathode pad metal can be 1.0 micron larger than the cathode metal Ohmic contact 224 to allow for alignment errors. The minimum width of the cathode pad metal is 11.0 microns. The cathode pad metal can be 10 microns away from the layout dimension of the mesa to facilitate lift-off of the cathode pad metal. Thus, the inner and outer dimensions of the cathode metal Ohmic contact 224 and cathode pad metal are determined by design rules dictated by the process and the dimension of the mesa. These parameters can be used in any embodiment of the avalanche photodiode described herein.

In one embodiment, the cathode pad metal can be identical with the anode pad and contact metal that is described herein. Before the cathode pad metal is deposited, there is a deep proton implant process that converts much of the N+ conduction layer 220 to semi-insulating in the area under the cathode and anode bond pads. The purpose of this proton implant is to minimize the anode pad capacitance. Both the anode bond pad and cathode bond pads are over dielectric on semi-insulating GaAs. In a high-speed photodiode, it is important to keep the total capacitance (junction+pad capacitance) at the lowest possible value for best performance. In one aspect, the deep proton implant can also be used to implant a portion of the mesa that is outside the active area. This use of the proton implant reduces junction capacitance.

In one embodiment, a passivation dielectric material can be deposited on the entire wafer as a passivation layer to provide protection from humidity when the APD 200 is not in a hermetic package. This passivation layer is typically a combination of silicon dioxide and silicon nitride. The thickness of the passivation layer can be tailored to the wavelength of the APD to give maximum responsivity. This is accomplished by having the total thickness of dielectric in the active region of the APD be an odd multiple of ¼ the design wavelength for that APD; typically the total thickness in the active area is ¾λ or 5/4λ.

In one embodiment, a Ti-etch can be included in the bond pad area. To allow the passivation dielectric to bond to the pad metal, both the anode contact and pad metal and the cathode pad metal are terminated with a thin layer of Ti. This Ti layer is removed in the bonding area on both the anode and cathode bond pads before the passivation dielectric is deposited. The Ti layer can be removed in the bonding area to allow good electrical contact with the ball bond on the anode and cathode bond pads.

Figure 3:
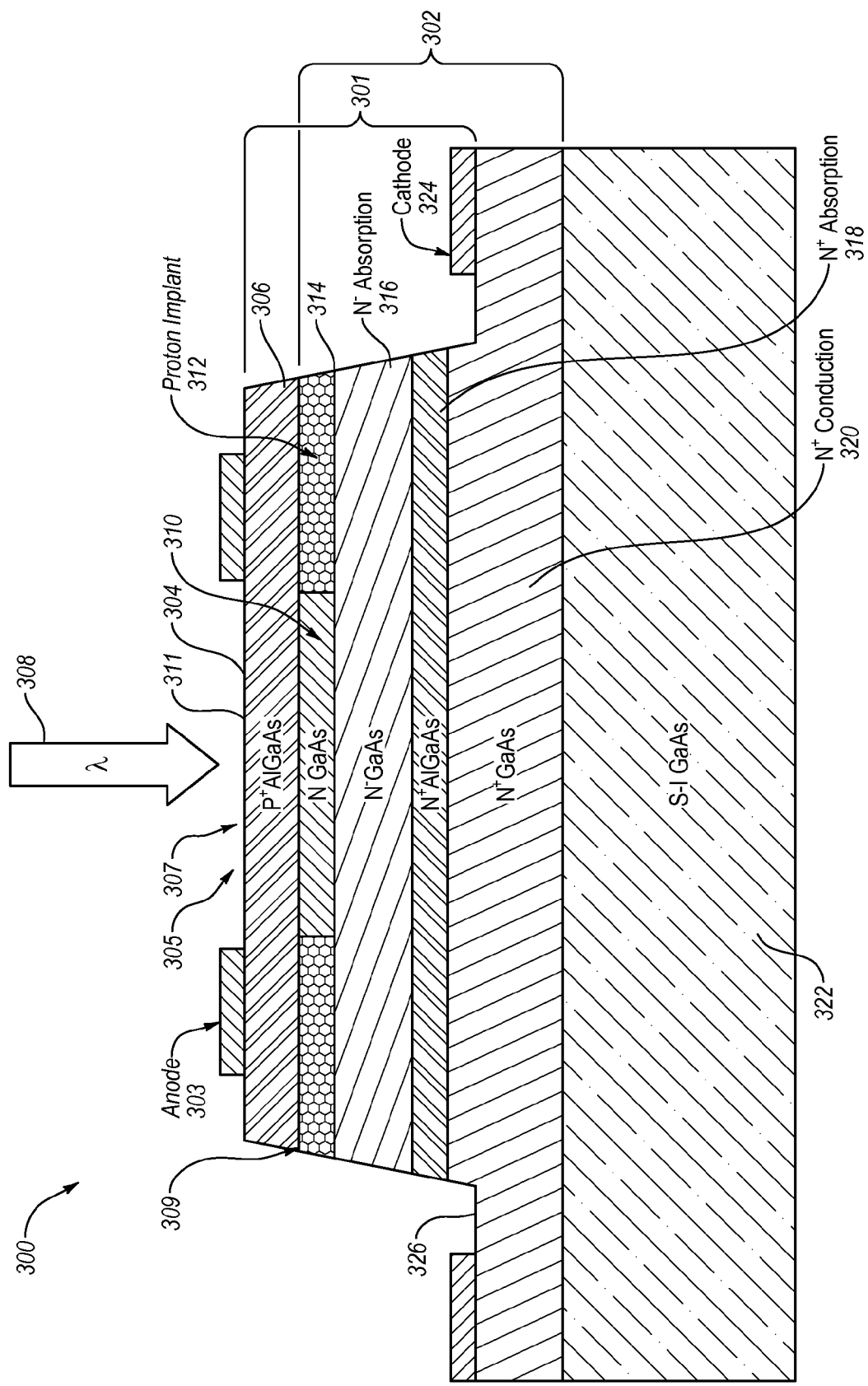
FIG. 3 includes an illustration of an embodiment of an avalanche photodiode with an N-type active region having selective implantation to reduce conductivity in the implanted areas.

In one embodiment, the N-type layer 210 needs to be higher conductivity than the higher breakdown voltage spacer region 212, which can be accomplished by making the N-type layer 210 to have higher conductivity by putting in an implant into the N-type layer 210 that increases its conductivity and leaving the higher breakdown voltage spacer region 212 as the deposited material without implantation. Alternatively, as shown in FIG. 3, an N-type layer 310 may not be implanted, but an implant region 312 is implanted so as to inhibit or stop conductivity (e.g., with beryllium implantation) in the higher voltage breakdown spacer region so that higher conductivity stays in the center of an APD 300 in the area of the N-type layer 310. This can make the N-type layer 310 more conductive than the implant region 312.

In one embodiment, the APD can be prepared so that the N-type layer 210 is more conductive than the region that surrounds the N-type layer 210 (e.g., the higher breakdown voltage spacer region 212).

In one example, an avalanche breakdown voltage for a $P^+N$ GaAs PN junction of 15 V can have a peak E-field at the junction of $\sim 7.4 \times 10^5$ V/cm. This can be achieved with an N-type layer doped to $1.3 \times 10^{17}$ cm$^{-3}$. At the breakdown voltage of 15 V, the depletion layer thickness can be 0.405 microns. For an 850-nm APD, a GaAs absorption region thickness of 0.405 microns can result in a low optical responsivity ($\sim 0.21$ mA/mW) and high junction capacitance per unit area.

In one embodiment, the windows (e.g., $P^+$ window layers) and blocking layers (e.g., $N^+$ barrier layers) of the APD can be transparent, such as being transparent to the intended wavelength of operation of the APD. While the window and blocking layers can be transparent to any wavelength of light, it can be advantageous for the window and blocking layers to be transparent to the intended wavelength of operation and may be non-transparent to other wavelengths that are significantly different from the intended wavelength. Absorption in the window and blocking layers may be limited to free carrier absorption due to high impurity concentration, and should not be band-to-band absorption that generates hole-electron pairs. Such band-to-band absorption outside the active thickness can reduce the signal bandwidth of the APD, and should be avoided.

FIG. 3 illustrates another embodiment of a photodiode 300 configured as an avalanche photodiode 300. The photodiode 300 can include a mesa region 301. The APD 300 can include an avalanche region 302 that is close to an optical entrance surface 304 of a window layer 306. The window layer 306 and at least a portion of the avalanche region 302 can be included in the mesa region 301. The window layer 306 can include an anode 303, which can be an annular anode as shown. An annular anode 303 can define an optical aperture 305 by an aperture 307 of the annular anode 303. The optical aperture 305 extends longitudinally with respect to a longitudinal axis (e.g., parallel to the longitudinal axis) of the aperture 307 of the annular anode 303. The sides of the optical aperture 305 can be defined by the sides of the annular anode 303 that define the aperture 307. The dimensions and compositions and other parameters of the APD 300 can be substantially as described with respect to the APD 200 of FIG. 2.

The avalanche region 302 can be a GaAs avalanche region 302 and can be close to the optical entrance at the optical entrance surface 304 because of low hole mobility of GaAs materials to preserve the optical bandwidth (BW) of the APD 300.

In an example of receiving about 850-nm light to the optical entrance surface 304, the window layer 306 can be a $P^+$ AlGaAs material. Also, the window layer 306 can be about 0.852 microns thick, or $+/-1\%$, 2%, 5%, 10%, 15%, or 20% thereof.

In one example, the window layer 306 can include an $Al_{0.15}Ga_{0.85}As$ P-type window layer. However, the mole fractions can vary between $Al_{0.12}Ga_{0.88}As$ to $Al_{0.4}Ga_{0.6}$, or between $Al_{0.13}Ga_{0.87}As$ to $Al_{0.35}Ga_{0.65}$, or between $Al_{0.15}Ga_{0.85}As$ to $Al_{0.3}Ga_{0.7}$. In one aspect, the window layer 306 can be transparent or substantially transparent to the wavelength of the light for a particular APD 300. If too much Al is used in the AlGaAs of the window layer 306, the hole mobility can be reduced and the series resistance can increase. For each wavelength there is an optimum window layer composition, which can be designed as desired.

The avalanche region 302 is adjacent or contacting a surface of the window layer 306 that is opposite of the optical entrance surface 304. The optical entrance surface 304 receives light 308 that passes through the window layer 306 and into the avalanche region 302. The avalanche region 302 includes the N-type layer 310 below and optionally directly adjacent with and optionally in contact with the window layer 306 opposite of the optical entrance surface 304. The N-type layer 310 can be patterned and can be prepared with moderately heavy doping. Also, the N-type layer 310 can be dimensioned such that it is only present in the optical aperture 305. That is, the sides of the N-type layer 310 can be aligned with the sides of the optical aperture 305, and thereby be aligned with the sides of the annular anode 303 that define the aperture 307. The N-type layer 310 can be only present in the optical aperture 305 so that it does not extend laterally past the sides of the optical aperture (e.g., the N-type layer 310 is not below the body of the annular anode 303, but only below the aperture 307 of the annular anode 303). The N-type layer 310 can be prepared from GaAs that is N-doped. The N-type layer 310 layer can be considered the active layer.

The avalanche region 302 includes the implant region 312 laterally from the N-type layer 310 to a mesa surface 314 of the mesa region 301. The implant can be a proton implant or beryllium implant, or other implant that reduces conductivity of the implant region 312. The implant region 312 can be configured as a single energy proton implant or beryllium implant that is around the perimeter of the optical aperture 305, and thereby under the body of the annular anode 303. The presence of the implant region 312 can convert the top region of the avalanche region 302 to be semi-insulating.

The avalanche region 302 can include an $N^-$ absorption layer 316 that is below and optionally directly adjacent with and optionally in contact with the N-type layer 310 and the implant region 312. As such, the $N^-$ absorption layer 316 can extend across the mesa region 301 to the mesa surface 314, and thereby be under both the N-type layer 310 and the implant region 312. The $N^-$ absorption layer 316 can be GaAs. The $N^-$ absorption layer 316 can be semi-insulating from the implant region 312, which can be similar to a gain guide implant process used in proton vertical cavity surface-emitting lasers (VCSELs).

The doping profile in the $N^-$ absorption layer 316 (e.g., N-type GaAs absorption layer) can be designed to give an avalanche voltage of about 15 V with a lateral depletion region that does not reach the mesa surface 314 of the mesa region 301.

An $N^+$ barrier layer 318 is below and optionally directly adjacent with and optionally in contact with the $N^-$ absorption layer 316. As such, the $N^+$ barrier layer 318 can extend across the mesa region 301 to the mesa surface 314, and thereby be under the N⁻ absorption layer 316. The N⁺ barrier layer 318 can be N⁺ AlGaAs. The N⁺ barrier layer 318 can be N-doped. The N⁺ barrier layer 318 can have N-doped AlGaAs as $Al_{0.15}Ga_{0.85}As$.

An N⁺ conduction layer 320 is below and optionally directly adjacent with and optionally in contact with the N⁺ barrier layer 318. The N⁺ conduction layer 320 can have a top portion that is part of the mesa region 301 and a bottom portion that is not part of the mesa region 301 such as being at or forming a shoulder 326 that extends laterally from the mesa. As such, the N⁺ conduction layer 320 can have a top portion that extends across the mesa region 301 to the mesa surface 314, and thereby be under the N⁺ barrier layer 318, and a bottom portion that extends laterally outward past the mesa surface 314 of the mesa region 301 to the shoulder 326. The N⁺ conduction layer 320 can be N⁺ GaAs. The N⁺ conduction layer 320 can be N-doped.

A substrate 322 is below and optionally directly adjacent with and optionally in contact with the N⁺ conduction layer 320. The substrate 322 can be an N-type GaAs substrate or a semi-insulating GaAs (S—I GaAs). An N-type GaAs substrate 322 can be N-doped.

A cathode 324, which can be an annular cathode, can be located on the N⁺ conduction layer 320. The cathode 324 can be on a surface of the N⁺ conduction layer 320 that is not part of the mesa region 301. As such, the N⁺ conduction layer 320 can have a top portion that is part of the mesa region 301 and a bottom portion that is not part of the mesa region 301, and such the bottom portion can extend laterally from the mesa surface 314 and be referred to as the shoulder 326 region.

In view of the embodiment of the avalanche photodiode in FIG. 3, the N⁺ barrier layer 318 can be an $Al_{0.15}Ga_{0.85}As$ layer and be located directly below the N⁻ absorption layer 316 that is GaAs in order to keep optically-generated carriers from the N⁺ conduction layer 320 of GaAs material from contributing to the response of the photodiode. Excluding these carriers gives the maximum optical bandwidth for the APD 300.

In one aspect, the implant region 312 can cause some shallow damage, and which damage can be overcome by doping compensation near the surface so as to achieve a good P-type Ohmic contact in the implant region 312. However, the implant region 312 can be excluded.

The configuration of the APD 300 can provide an avalanche gain process that is optimized when the avalanche region 302 is confined to a narrow region adjacent to a P-type window layer 306 by using nonuniform doping of the N⁻ absorption layer 316 of GaAs material. The N-type doping in the GaAs material of the N⁻ absorption layer 316 can be highest adjacent to or closest to the P-type window layer 306, and the N-type doping can be comparatively lower through the remainder of the N⁻ absorption layer 316. The energy and dose of the implant region 312 is selected to compensate this heavier doped region of the N⁻ absorption layer 316 to become semi-insulating.

By making the aperture 307 of the annular anode 303 (e.g., metal anode material) and the aperture of a single energy proton implant region 312 the same dimensions and longitudinally aligned, the avalanche gain can be confined to the central region of optical input, which can be considered the optical aperture 305. The aperture of a proton implant region 312 can be the N-type layer 310. Accordingly, the N-type layer 310 can be the N-type doping region of the N⁻ absorption layer 316 that is the highest, as described above. The annular region of the implant region 312 can extend about 10 microns from the mesa surface 314 of the top of the mesa region 301. This configuration can provide for the reverse bias depletion region not reaching the radial surface of the mesa.

Accordingly, the GaAs material of the N⁻ absorption layer 316 can have a top middle portion (e.g., aperture) that is heavier doped so as to form the N-type layer 310 and a top outer portion (e.g., annular) that is configured as the implant region 312.

In one embodiment, the N-type layer 310 can be grown across wafer, and then converted to the implant region 312 by implantation of a component that reduces conductivity in the implant region 312 compared to the N-type layer 310. For example, the implant region 312 can be formed by proton or beryllium implantation therein. As such, the implant region 312 includes a conductivity reducing implant.

Figure 3A:
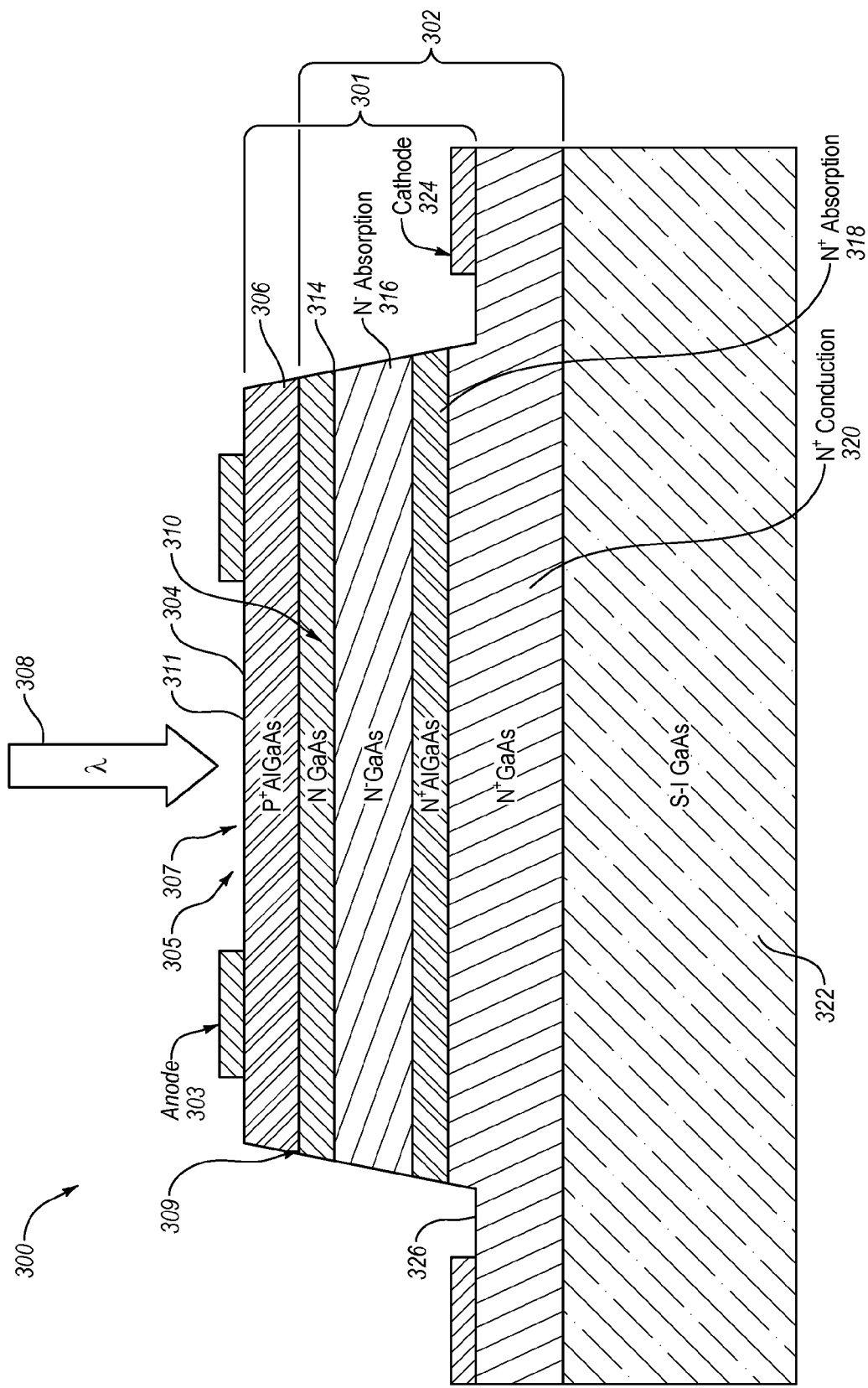
FIG. 3A includes an illustration of an embodiment of an avalanche photodiode with an N-type active region having an N-type GaAs layer extending across the photodiode between slopes of a mesa.

In one embodiment as illustrated in FIG. 3A, the avalanche photodiode 300 can have a modification where the N-type layer 310 extends all the way across the photodiode 300 as a continuous layer. Accordingly, the N-type layer 310 may not have a lateral implant region (e.g., a lateral implant region 312 of FIG. 3). It has been found that having the N-type layer 310 extending all the way across the mesa region 301 between the mesa surface 314 provides good performance, even without implanting the lateral regions. As such, the N-type layer 310 can form a portion of the mesa surface 314. Thus, the photodiode can be devoid of an implant region laterally of the N-type layer 310. Other than dimension and arrangement, the material of the N-type layer 310 can be the same as described in connection with FIG. 3. This can include the N-type layer 310 being prepared from GaAs that is N-doped. The sloped edge of the N-type layer 310 can be about 60-65 degrees (e.g., +/−1%, 2%, 5%, 10%, 15%, or 20% thereof), which angle can be used for the entire mesa. The configuration of the N-type layer 310 has been established to be sufficient to lower the field of the surface so that there is not any edge breakdown.

Now, manufacturing can be simplified because the N-type layer 310 does not have the lateral region etched or proton implanted. Accordingly, the epitaxial growth of the N-type layer of Step 1 of FIG. 5 can be used, and the Step 2 can be omitted.

Figure 4:
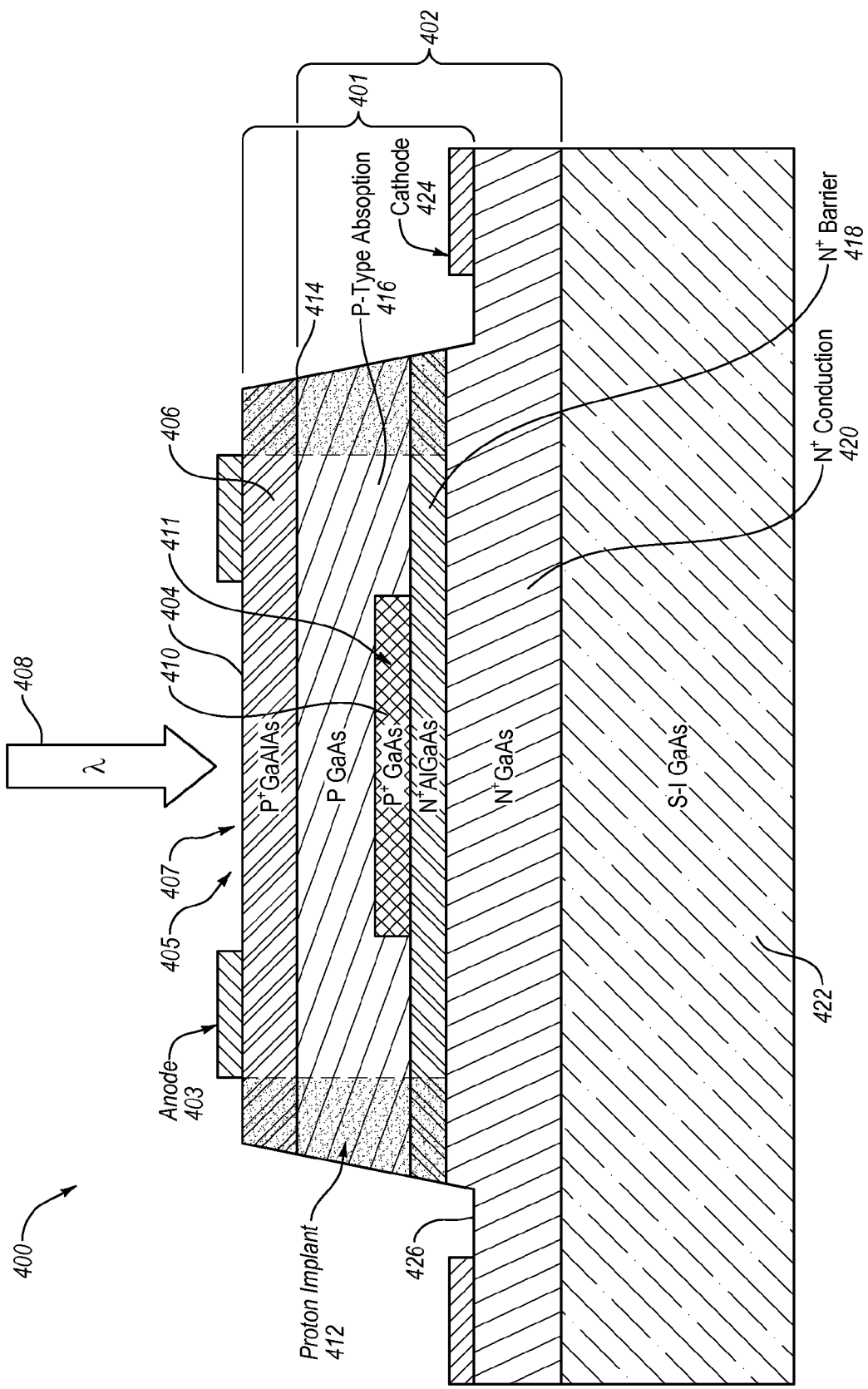
FIG. 4 includes an illustration of an embodiment of an avalanche photodiode with a P-type active region.

FIG. 4 illustrates another embodiment of a photodiode 400 configured as an avalanche photodiode 400. The avalanche photodiode 400 can be substantially as in FIG. 2 or 3; however, the active region can be a P-type active region, which can be prepared substantially similarly as described herein with the exception that the processing inverts the location of any beryllium implant. As such, the dimensions and configurations of the P-type active region can be the same as the dimensions and configurations of the N-type active region described herein. In the photodiode 400, the beryllium implant is now within the active region. The photodiode 400 can include a mesa region 401. An APD 400 can include an avalanche region 402 that is close to an optical entrance surface 404 of a window layer 406. The window layer 406 and at least a portion of the avalanche region 402 can be included in the mesa region 401. The window layer 406 can include an anode 403, which can be an annular anode as shown or "C" shaped anode, or any arced shape. The anode 403 can define an optical aperture 405 by an aperture 407 of the anode 403. The optical aperture extends longitudinally with respect to a longitudinal axis (e.g., parallel to the longitudinal axis) of the aperture 407 of the anode 403. The sides of the optical aperture 405 can be defined by the sides of the anode 403 that define the aperture 407. The dimensions and compositions and other parameters of the APD 400 can be substantially as described with respect to the APD 200 of FIG. 2.

The avalanche region 402 can be a GaAs avalanche region 402 and can be close to the optical entrance at the optical entrance surface 404 because of low hole mobility of GaAs materials to preserve the optical bandwidth (BW) of the APD 400.

In an example of receiving about 850-nm light to the optical entrance surface 404, the window layer 406 can be a P+ AlGaAs material. Also, the window layer 406 can be about 0.852 microns thick, or +/−1%, 2%, 5%, 10%, 15%, or 20% thereof.

In one example, the window layer 406 can include an $Al_{0.15}Ga_{0.85}As$ P-type window layer. However, the mole fractions can vary between $Al_{0.12}Ga_{088}As$ to $Al_{0.4}Ga_{06}$, or between $Al_{0.13}Ga_{0.87}As$ to $Al_{0.35}Ga_{0.65}$, or between $Al_{0.15}Ga_{0.85}As$ to $Al_{0.3}Ga_{0.7}$. In one aspect, the window layer 406 can be transparent or substantially transparent to the wavelength of the light for a particular APD 400. If too much Al is used in the AlGaAs of the window layer 406, the hole mobility can be reduced and the series resistance can increase. For each wavelength there is an optimum window layer composition, which can be designed as desired.

The avalanche region 402 is adjacent or contacting a surface of the window layer 406 that is opposite of the optical entrance surface 404. The optical entrance surface 404 receives light 408 that passes through the window layer 406 and into the avalanche region 402.

The avalanche region 402 can include a P− absorption layer 416 below and optionally directly adjacent with and optionally in contact with the window layer 406 opposite of the optical entrance surface 404. The P− absorption layer 416 can have a center region under the optical aperture 405 that is not implanted, and can include an implant region 412 that is implanted, such as by proton implanting.

The avalanche region 402 includes a P-type layer 410 within or below the P− absorption layer 416. The P-type layer 410 can be patterned and can be prepared with moderately heavy doping. Also, the P-type layer 410 can be dimensioned such that it is only present in the optical aperture 405. That is, the sides of the P-type layer 410 can be aligned with the sides of the optical aperture 405, and thereby be aligned with the sides of the anode 403 that define the aperture 407. The P-type layer 410 can be only present in the optical aperture 405 so that it does not extend laterally past the sides of the optical aperture (e.g., the P-type layer 410 is not below the body of the anode 403, but only below the aperture 407 of the anode 403). The P-type layer 410 can be prepared from GaAs that is P-doped. The P-type layer 410 can have more P doping compared to the P− absorption layer 416. As such, the P− absorption layer 416 can be P− and the P-type layer 410 can be P+. The P-type layer 410 can be considered the active layer.

Optionally, the P-type layer 410 can include a beryllium implant 411.

In another option, the P-type layer 410 can extend across the mesa region 401 so that sides of the P-type layer 410 form a portion of mesa sides 414. Here, the implant region 412 can be omitted. As such, the P-type layer 410 can be configured as the N-type layer of FIG. 3A.

The avalanche region 402 includes the implant region 412 laterally from the P− absorption layer 416 and laterally from the P-type layer 410 to a mesa surface 414 of the mesa region 401. The implant can be a proton implant or other implant that reduces conductivity of the implant region 412. The implant region 412 can be configured as a single energy proton implant that is around the perimeter of the optical aperture 405, and thereby under the body of the anode 403. The presence of the implant region 412 can convert the top region of the avalanche region 402 to be semi-insulating.

The doping profile in the P− absorption layer 416 (e.g., P-type GaAs absorption layer) can be designed to give an avalanche voltage of about 15 V with a lateral depletion region that does not reach the mesa surface 414 of the mesa region 401.

An N+ barrier layer 418 is below and optionally directly adjacent with and optionally in contact with the P− absorption layer 416 and the P-type layer 410. As such, the N+ barrier layer 418 can extend across the mesa region 401 to the mesa surface 414, and thereby be under the P− absorption layer 416 and the P-type layer 410. The N+ barrier layer 418 can be N+ AlGaAs. The N+ barrier layer 418 can be N-doped. The N+ barrier layer 418 can have N-doped AlGaAs as $Al_{0.15}Ga_{0.85}As$.

An N+ conduction layer 420 is below and optionally directly adjacent with and optionally in contact with the N+ barrier layer 418. The N+ conduction layer 420 can have a top portion that is part of the mesa region 401 and a bottom portion that is not part of the mesa region 401. As such, the N+ conduction layer 420 can have a top portion that extends across the mesa region 401 to the mesa surface 414, and thereby be under the N+ barrier layer 418, and a bottom portion that extends laterally outward past the mesa surface 414 of the mesa region 401. The N+ conduction layer 420 can be N+ GaAs. The N+ conduction layer 420 can be N-doped.

A substrate 422 is below and optionally directly adjacent with and optionally in contact with the N+ conduction layer 420. The substrate 422 can be an N-type GaAs substrate or a semi-insulating GaAs (S—I GaAs). An N-type GaAs substrate 422 can be N-doped.

A cathode 424, which can be an annular cathode, can be located on the N+ conduction layer 420. The cathode 424 can be on a surface of the N+ conduction layer 420 that is not part of the mesa region 401 such that the cathode 424 is on a shoulder 426. As such, the N+ conduction layer 420 can have a top portion that is part of the mesa region 401 and a bottom portion that is not part of the mesa region 401, and such bottom portion can extend laterally from the mesa surface 414 and be referred to as the shoulder 426 region.

In one embodiment, proton implants are used to convert conducting material to nonconducting material. This is used to guide current to particular parts of the structure. The perimeter regions between the central active regions and mesa surface can include proton implants as described herein.

In one embodiment, beryllium implants can be used in the perimeter regions to reduce current in the perimeter regions. Beryllium implants are P-type, and can be used to compensate N-type material (e.g., decrease conduction, such as in perimeter regions) or enhance P-type material (e.g., more conduction; see FIG. 4). In the structure of the present invention of FIG. 3, beryllium implants can be used to reduce the conductivity of the N-type perimeter area and create a higher breakdown region to encourage avalanche detection in the center of the photodiode.

Figure 4A:
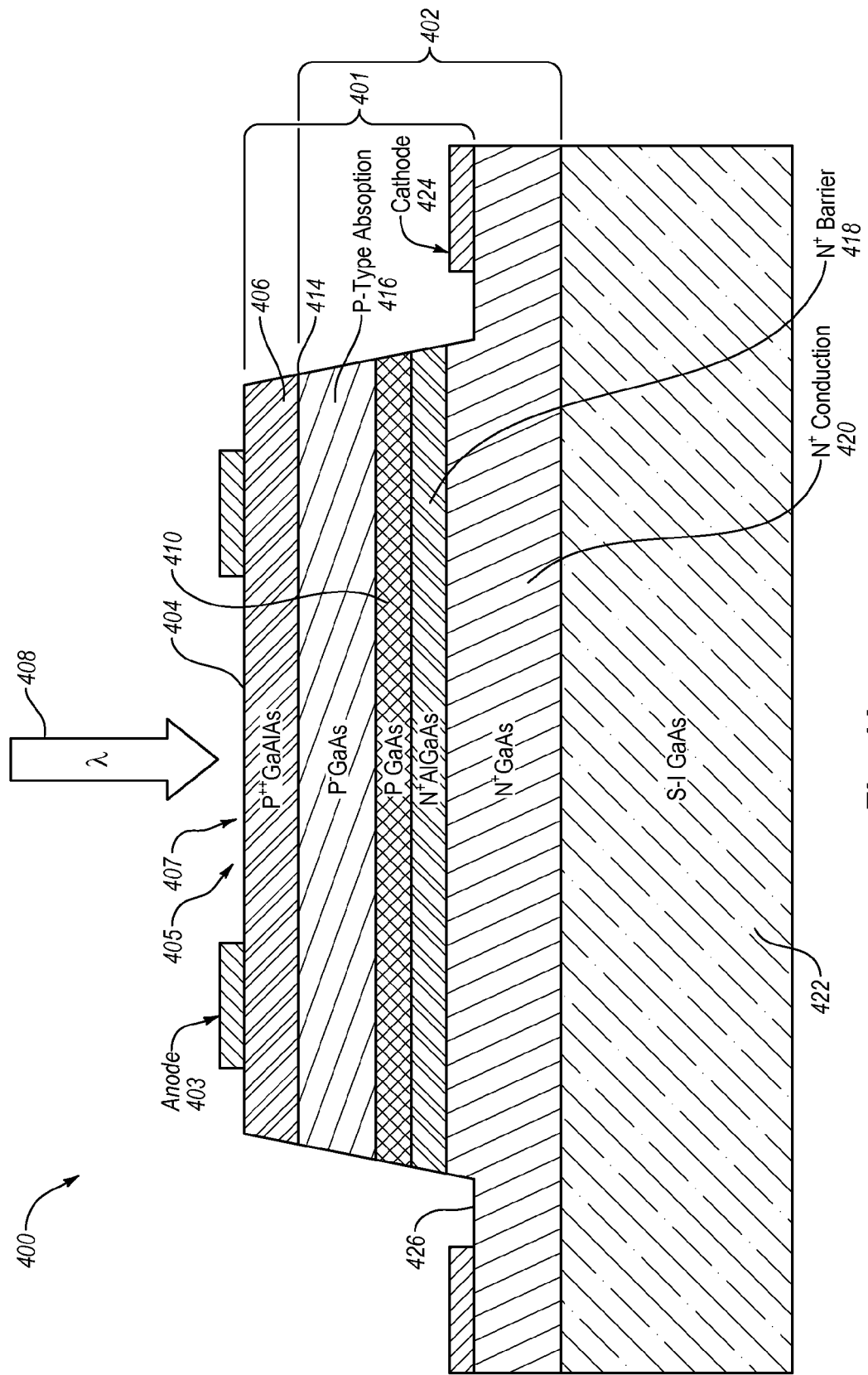
FIG. 4A includes an illustration of another embodiment of an avalanche photodiode with a P-type active region.

FIG. 4A illustrates another embodiment of a photodiode 400 configured as an avalanche photo diode 400 that is similar to FIG. 4; however, the active region can be a P-type active region, which can be prepared substantially similarly as described herein with the exception that the P-type layer 410 extends all the way across the mesa. As such, the P− absorption layer 416 and P-type layer 410 both extend across the mesa, and the P− absorption layer 416 does not have a portion that is lateral of the P-type layer 410. Also, the P− absorption layer 416 can be doped with about $1 \times 10^{14}$ (e.g., 1e14); however the doping can range and described herein or known in the art. The P-type layer 410 can be doped with about $1 \times 10^{17}$ (e.g., 1e17) to about $2 \times 10^{17}$ (e.g., 2e17); however the doping can range and described herein or known in the art. Additionally, the window layer 406 can be a P++ GaAlAs. This embodiment may optionally be devoid of lateral implanting or include lateral implanting as described herein. This embodiment may also optionally include the beryllium implant or be devoid thereof. The manufacture can be as described herein; however, the P-type layer 410 is not etched.

Figure 5:
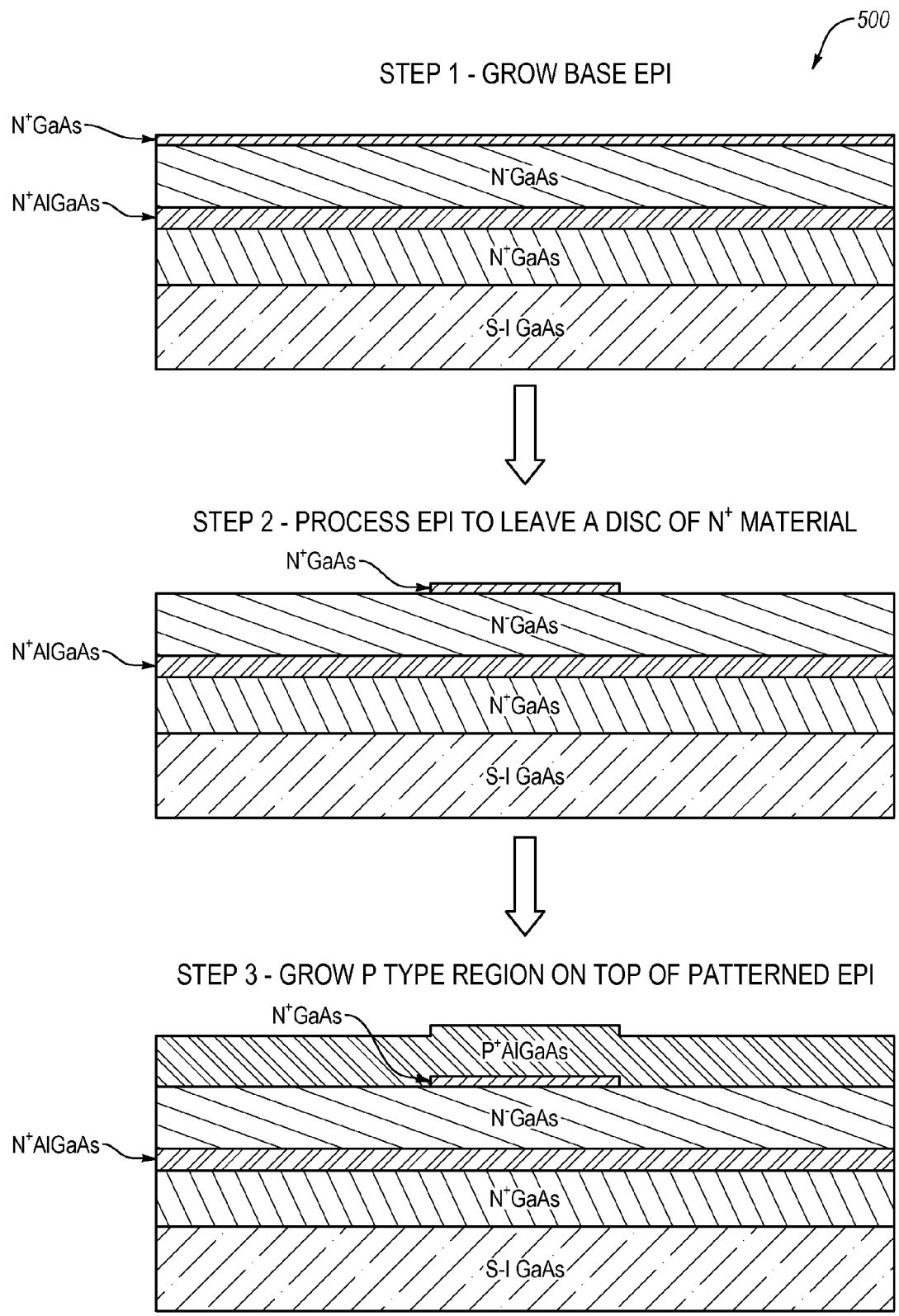
FIG. 5 includes an illustration of an interrupted growth process for preparing an avalanche photodiode.

FIG. 5 illustrates a process 500 for preparing an avalanche photodiode in accordance with the present invention. In one embodiment, the process 500 includes Step 1, Step 2, and Step 3. However, Step 2 can be omitted in some instances, such as when the active region extends all the way across the mesa so as to not be etched.

Step 1 includes a process for growing a base epitaxial structure (EPI), which EPI includes: S—I GaAs substrate, an $N^+$ GaAs $N^+$ conduction layer on the S—I GaAs substrate, an $N^+$ AlGaAs $N^+$ barrier layer on the $N^+$ GaAs $N^+$ conduction layer, a $N^-$ absorption layer on the $N^+$ AlGaAs $N^+$ barrier layer, and an $N^+$ GaAs N-type layer on the $N^-$ absorption layer. Step 2 includes a process for processing the EPI to leave a disc of $N^+$ material, which is the disc being the $N^+$ GaAs N-type layer. The disc-shape material on the EPI can be considered a patterned EPI. Step 3 includes a process for growing a P-type AlGaAs P-type region on top of the patterned EPI. As shown, a layer of substantially the same thickness of a P-type AlGaAs material is grown as the P-type region over the $N^+$ GaAs N-type layer disc and over the $N^-$ absorption layer. Since the disc has a thickness, the P-type region includes a stepped or raised portion over the disc compared to over the $N^-$ absorption layer. Thus, the disc causes a plateau being formed in the P-type region because the same thickness of P-type AlGaAs is over the $N^-$ absorption layer and disc. The height of the plateau can be the thickness of the disc. However, selective processing may result in there being no plateau of P-type AlGaAs, as the P-type region may have a smooth or continuous surface or the plateau as illustrated.

Figure 6:
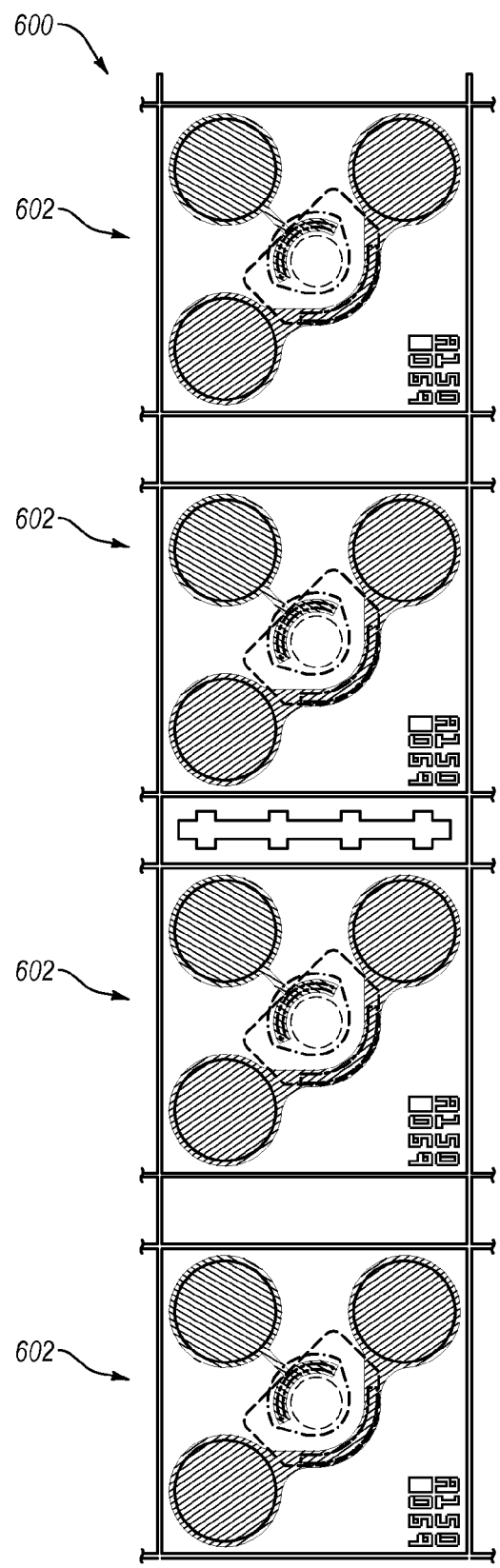
FIG. 6 includes an illustration of a portion of a wafer having a plurality of avalanche photodiode chips.

FIG. 6 illustrates a 1×4 APD array 600 having four different APDs 602 in a row. However, a wafer may have any reasonable number of APDs 602 on a wafer. Individual APDs 602 can be configured as described herein, and can include the features described in connection to FIG. 7. The APD array 600 can be grown by the following process of Step 1 through Step 24. However, some of the steps, such as etching the active region, can be omitted.

Figure 7:
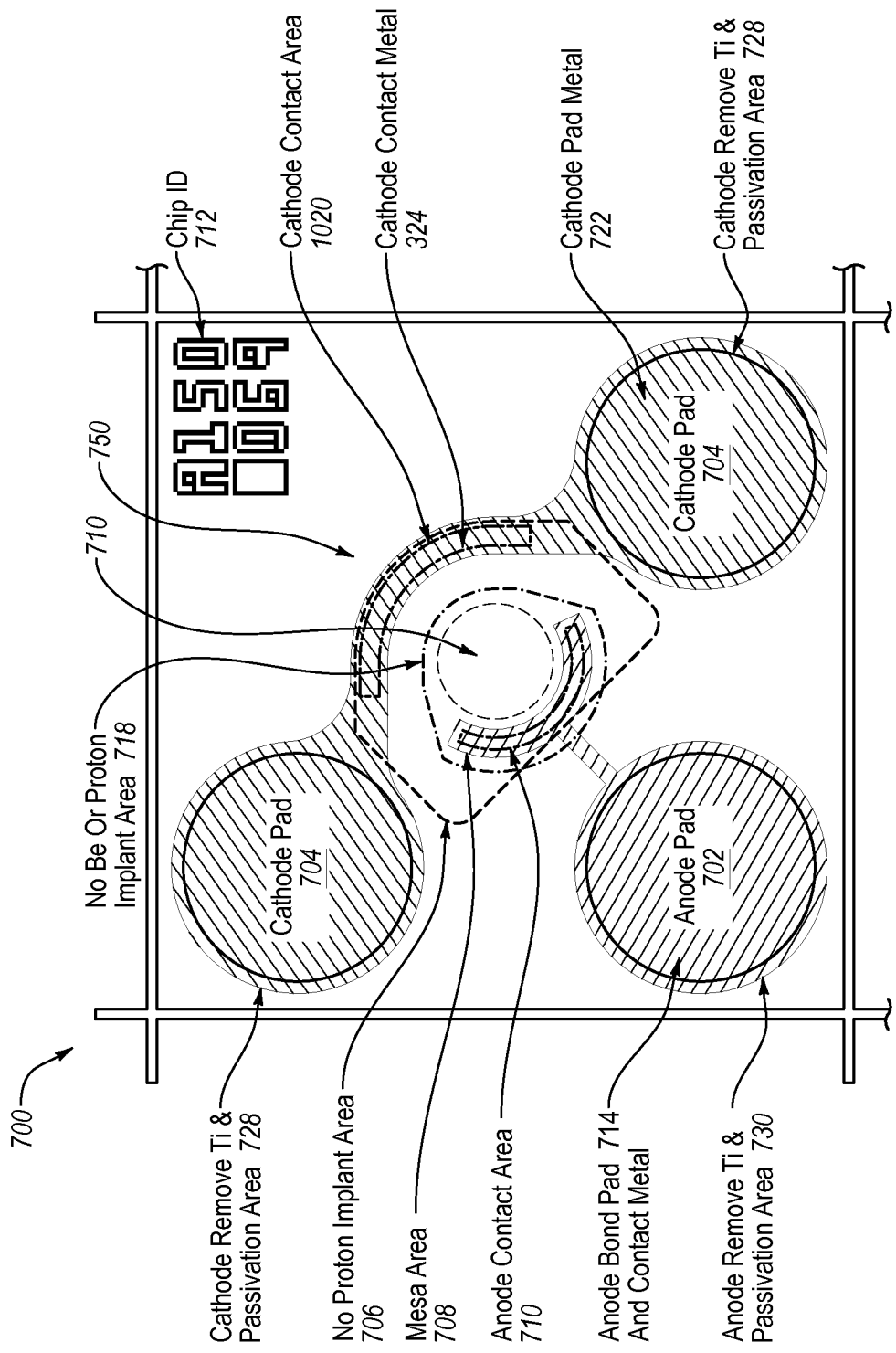
FIG. 7 includes an illustration of an avalanche photodiode chip.

FIG. 7 illustrates an embodiment of an APD chip 700 that includes the configuration of FIG. 3, such as a semi-insulating GaAs substrate 322, then the $N^+$ GaAs conduction layer 320, then an $N^+$ Al$_{0.3}$Ga$_{0.7}$As barrier layer 318, then an $N^-$ GaAs absorption layer 316, then an N GaAs N-type layer 310, then the P$^+$ GaAs/Al$_{0.3}$Ga$_{0.7}$As ramp (an interface region 309 between 310 and 306 and between 312 and 306, see FIG. 3), then a P$^+$ Al$_{0.3}$Ga$_{0.7}$As window layer 306, then a P$^+$ GaAs cap layer 311 (surface layer of the window layer 306, see FIG. 3).

Step 1 can include growing an APD EPI 710 on the semi-insulating GaAs substrate 322, which can include: growing an $N^+$ GaAs conduction layer 320 to a thickness of about 3000 nm; thereon growing the $N^+$ Al$_{0.3}$Ga$_{0.7}$As barrier layer 318 (e.g., lower cladding layer about 220 nm thick with GaAs/AlGaAs ramps (e.g., about 50 nm thick each) above and below so as to be about 320 nm thick, wherein the lower ramp is grown, then the barrier layer is grown, and then the upper ramp is grown to provide the thickness of the $N^+$ barrier layer 318); thereon growing the $N^-$ GaAs absorption layer 316 that is doped at about <1.0×10$^{18}$ cm$^{-3}$ that is about 1745 nm thick; thereon growing the N GaAs N-type layer 310 that is doped at about 1.3×10$^{17}$ cm$^{-3}$ that is about 355 nm thick; thereon growing a P$^+$ GaAs/Al$_{0.3}$Ga$_{0.7}$As ramp 309 that is doped at about 1.0×10$^{17}$-1.3×10$^{19}$ cm$^{-3}$ that is about 40 nm thick; and thereon growing the P$^+$ Al$_{0.3}$Ga$_{0.7}$As window layer 306 (e.g., upper cladding layer) doped at about 1.3×10$^{19}$ cm$^{-3}$ that is about 852 nm thick; and thereon growing the P$^+$ GaAs cap layer 311 that is doped at about 6.0×10$^{19}$ cm$^{-3}$ that is about 40 nm thick. It should be recognized that the parameters of this step and the following steps can be modulated and adjusted for improvement or optimization.

Figure 12:
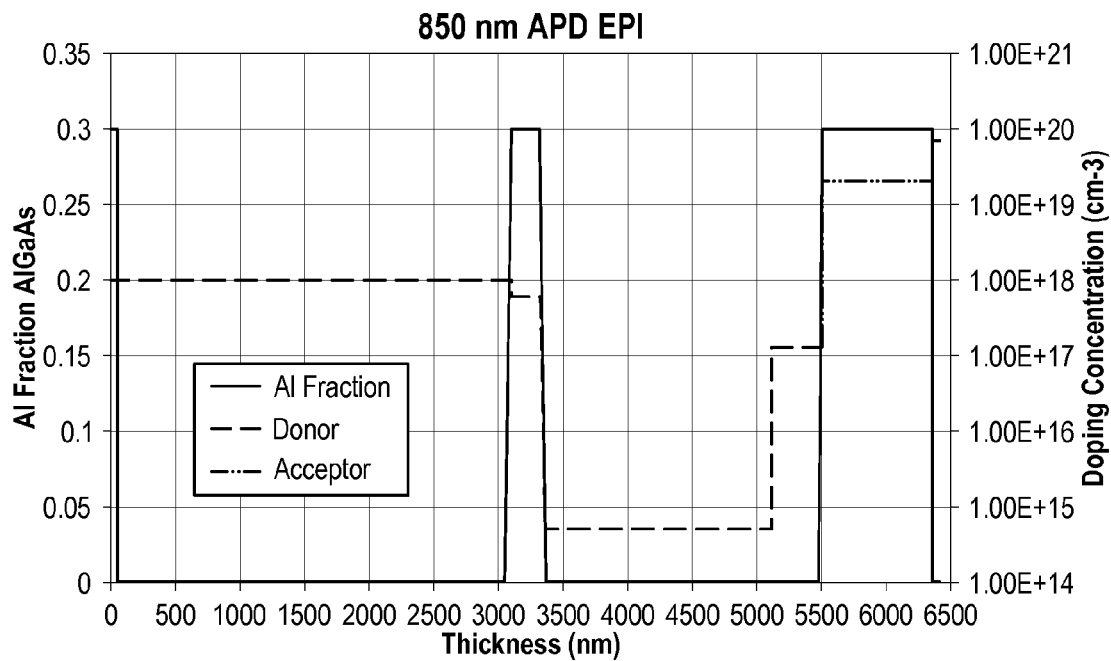
FIG. 12 includes a compositional and doping diagram of an embodiment of an avalanche photodiode.
Figure 13:
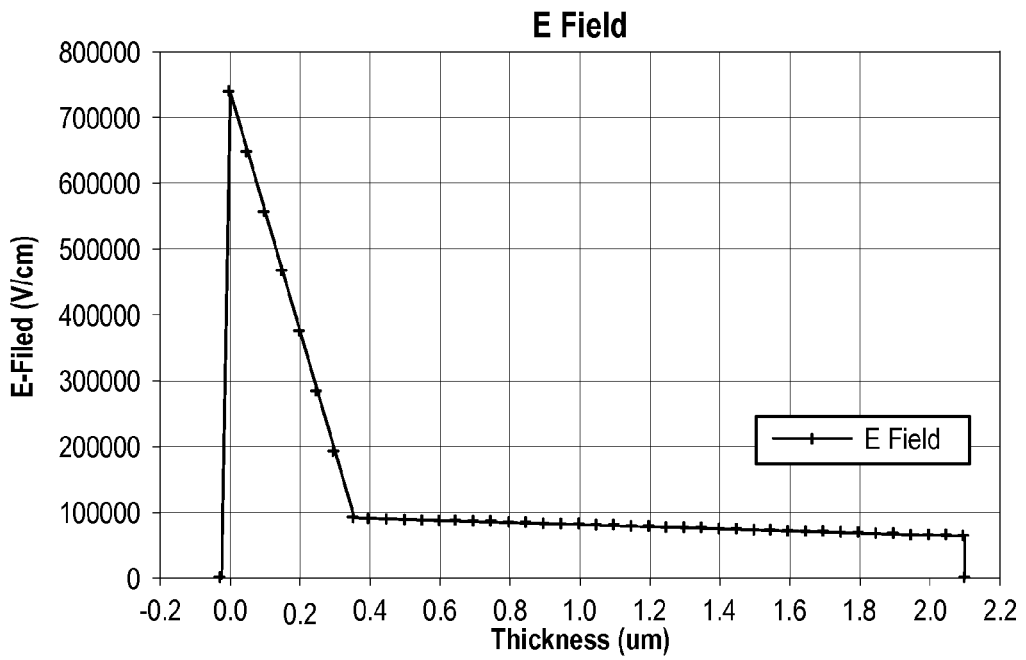
FIG. 13 includes an E-field diagram of an embodiment of an avalanche photodiode.

Table 1 shows parameters for an example of the APD EPI 710 obtainable from Step 1. Additional notes can include: the substrate being semi-insulating; the spacer layer being grown before a pause for reducing temperature, and can be high temperature NID; the absorption layer can be N-type with mobility >5000 cm$^2$/Vs; and the N-type layer can be NID. The example from Table 1 can be an 850-nm APD EPI, which can be in accordance with FIG. 12. It may also have an E-field versus thickness plot as shown in FIG. 13.

Figure 8:
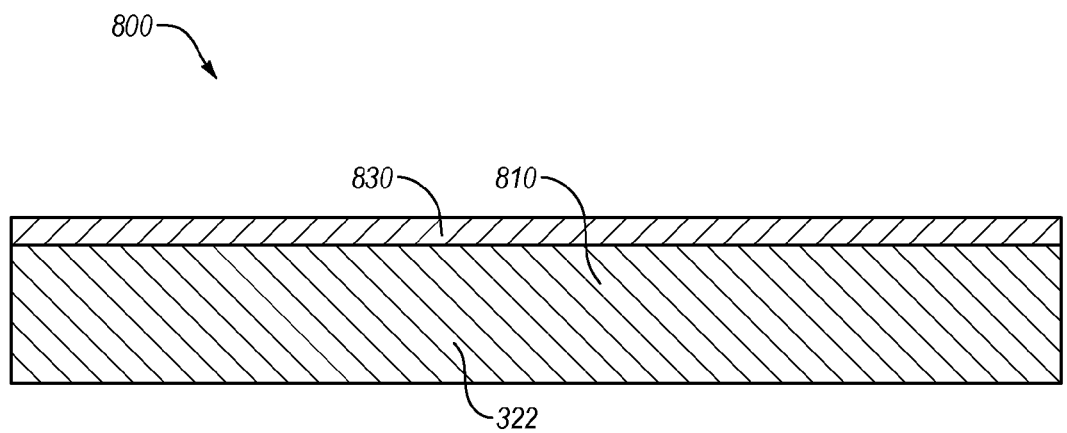
FIG. 8 includes a view of an intermediate avalanche photodiode during manufacture having an oxide layer.

Step 2 can include depositing an oxide layer 830 that is about 1450 Å to 2900 Å thick onto the P$^+$ GaAs cap layer 311. FIG. 8 shows an ADP EPI 810 of a chip 800 on the substrate 322 having the oxide layer 830.

Step 3, which may be optional, can include etching the oxide layer 830 to define a chip ID 712.

Step 4 can include applying a photoresist pattern onto the oxide layer 830 to protect a central portion (e.g., a no Be or proton implant area 718) of a mesa area 708 from Be or proton implantation.

Step 5 can include performing Be or proton implantation to the EPI in perimeter areas that are exposed (e.g., perimeter around central portion) to form the implant region 312 (e.g., perimeter spacer region), where the photoresist covers and protects the central portion of the EPI, the Be or proton implantation being sufficient to lower net donor concentration in the N GaAs N-type layer, which confines the avalanche breakdown to the photoresist central protected area (e.g., central portion) and excludes the avalanche breakdown from the perimeter areas around the central portion. The central portion can be the active area or optical active area. This step can be omitted.

Step 6 can include etching the EPI to form the mesa region 301, the etching being to a depth of about 1.0 microns into the $N^+$ GaAs conduction layer 320, wherein the mesa slope of the mesa surface 314 is about 60-70° or about +/−20%, 15%, 10%, 5%, 2.5%, or 1% thereof. During or after etching, the photoresist can be removed, or it can be retained in the EPI.

Figure 9:
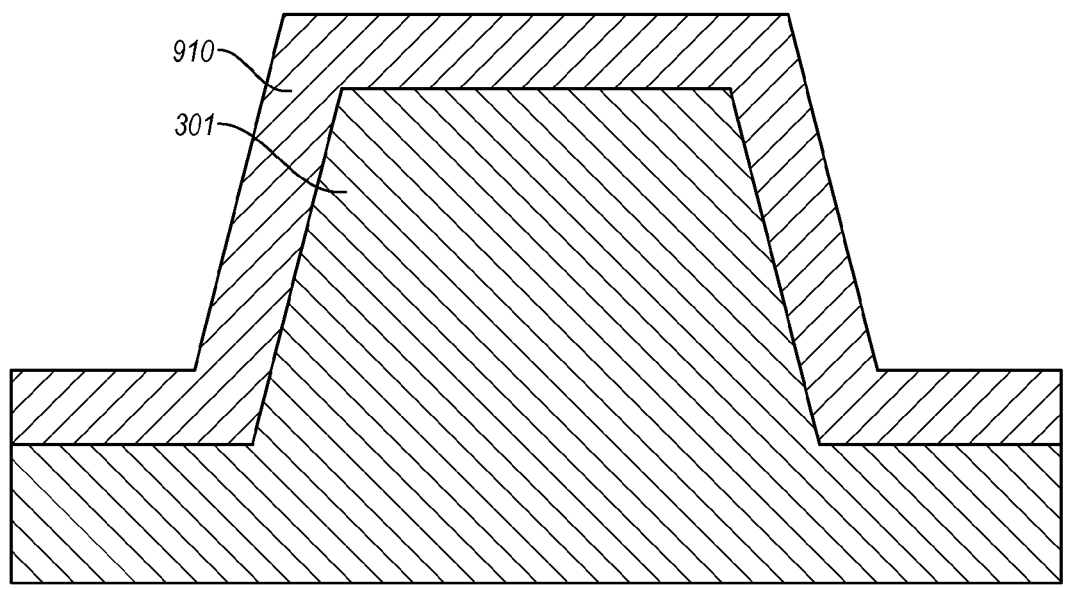
FIG. 9 includes a view of an intermediate avalanche photodiode during manufacture having a passivation layer on the mesa.

Step 7 can include depositing a 145-nm silicon nitride dielectric over the wafer, which can be a passivation layer 910. The silicon nitride dielectric material can be deposited by any process known in the art. FIG. 9 shows an embodiment with the mesa region 301 having the passivation layer 910.

Step 8 can include applying a second photoresist pattern to the passivation layer in order to protect a no proton implant area 706, the no proton implant area 706 being defined by the shape of the second photoresist pattern. The no proton implant area 706 can include the central portion of the mesa, and the no proton implant area 706 can exclude the perimeter areas around the central portion of the mesa. The no proton implant area 706 can be shaped as defined in FIG. 7.

Step 9 can include performing multi-energy proton implantation of the EPI to convert the $N^+$ GaAs conduction layer to semi-insulating layer. The $N^+$ GaAs conduction layer is described in the FIGS. 2-4; however, it may be referred to as the $N^+$ GaAs implanted semi-insulating layer after such proton implantation. However, $N^+$ GaAs conduction layer may also refer to the semi-insulating layer when referring to the EPI or APD after such proton implantation has been performed.

Step 10 can include applying a photoresist pattern to the no Be or proton implant area 718 so as to protect a central portion of mesa from Be or proton implantation. Step 10A can include Be or proton implantation.

Step 11 can include applying a third photoresist to the EPI with exposed areas that define an anode contact area 1010 and a cathode contact area 1020. The anode contact area 1010 and the cathode contact area 1020 can be annular or can be full or partial circles, and may be "C" shaped. The anode contact area 1010 and the cathode contact area 1020 can be as illustrated and described herein.

Figure 10:
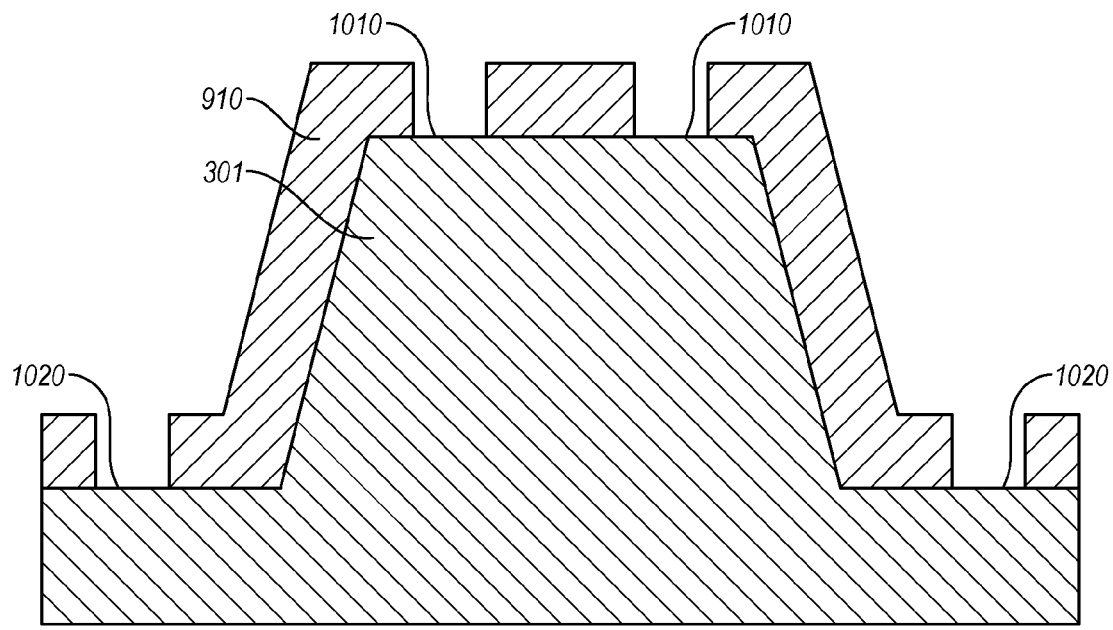
FIG. 10 includes a view of an intermediate avalanche photodiode during manufacture having a passivation layer on the mesa, with the passivation layer having etched openings for anode and cathode contact areas.

Step 12 can include etching a 145-nm silicon nitride passivation layer 910 to open anode and cathode contact areas. The etch may or may not also be through a deposited oxide layer 830 that can be 1450 A to 2900 A. As such the deposited oxide layer 830 may be exposed by the etching, or it may be etched to expose the $P^+$ GaAs cap layer 311 and etch into a portion of the $N^+$ conduction layer 320. During or after etching, the photoresist can be removed, or it can be retained in the EPI. FIG. 10 illustrates an etched anode contact area 1010 and the cathode contact area 1020 in the passivation layer 910.

Step 13 can include applying a fourth photoresist to define a cathode contact metal area 1020. The cathode contact metal area 1020 is defined now while an anode contact metal area 1010 is defined later as they may be two different metal material compositions as is known in the art.

Figure 11:
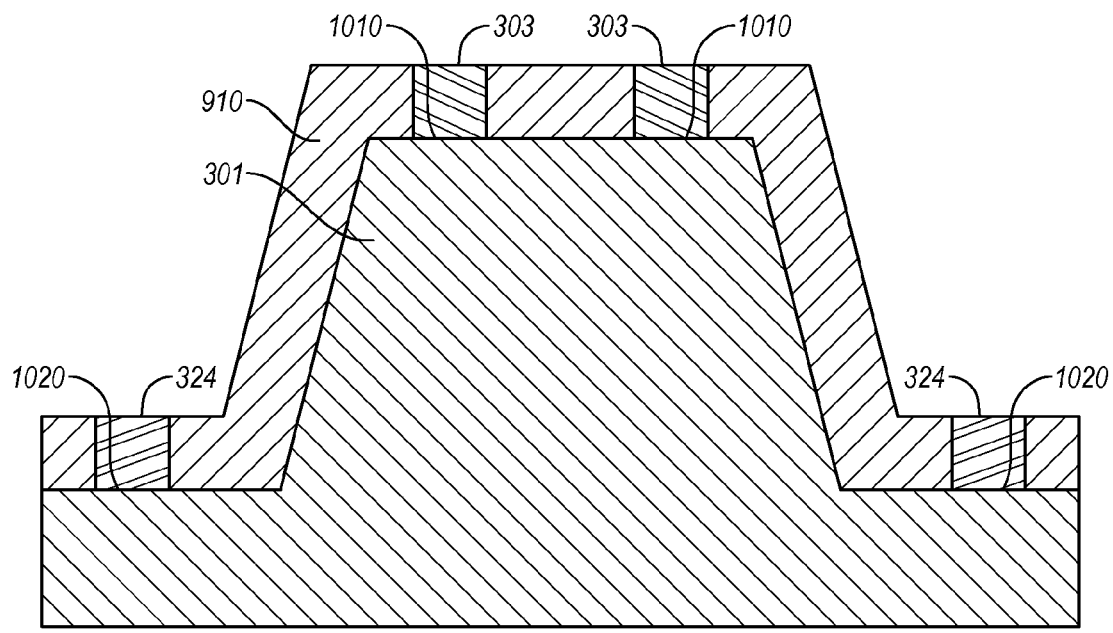
FIG. 11 includes a view of an intermediate avalanche photodiode during manufacture having a passivation layer on the mesa, with the passivation layer having anode and cathode contacts therein.

Step 14 can include deposition and lift-off of cathode contact metal into the cathode contact metal area 1020 to form the cathode 324. Any process can be used to form the cathode 324 as is known in the art. FIG. 11 shows the cathode 324 in the cathode contact area 1020.

Step 15 can include forming an alloy cathode contact metal in the cathode contact metal area 1020. Any alloying process can be used to form the cathode alloy composition as is known in the art.

Step 16 can include applying a fifth photoresist to define an anode bond pad area 714 and the anode contact metal area 1010. The cathode areas are covered as the anode components need to be formed.

Step 17 can include deposition and lift-off of an anode bond pad 702 in the anode bond pad area 714 and anode contact metal in the anode contact metal area 1010. Any process can be used to form the anode contact and the anode bond pad 702 as is known in the art. FIG. 11 shows the annular anode 303 in the cathode contact area 1020.

Step 18 can include applying a sixth photoresist to remove Ti in the anode bond pad area 714 and/or remove Ti from the anode contact metal area 1010. This process can be done on an anode remove Ti and passivation area 730.

Step 19 can include apply a seventh photoresist to define a cathode pad metal 722 area.

Step 20 can include deposition and lift-off of cathode bond pad metal in the cathode bond pad areas to form cathode bond pads 704.

Step 21 can include applying an eight photoresist to remove Ti in cathode bond pad areas and/or remove Ti from the cathode contact metal area 1020. This process can be done on a cathode remove Ti and passivation area 728.

Step 22 can include depositing a passivation layer 750 of silicon nitride/silicon dioxide dielectric material. The passivation layer 750 can be over any portion or a whole chip 700.

Step 23 can include applying a ninth photoresist to define the anode bond pad 702 and define the cathode bond pads 704.

Step 24 can include removing the passivation layer 750 of dielectric material in the anode bond pad 702 and in the cathode bond pad 704. This can be by etching.

As such, the APD array 600 can include the layers and features obtained by the manufacture process. The process can be by MBE or MOCVD.

The processing described herein may be modulated in accordance with the embodiments of the APDs described herein. The processing can be performed in order to obtain an active region aligned with the N-type layer (e.g., 210, 310, and 410), which can be a disc shape, where there is an anti-reflection coating on the optical entrance. The final thickness of any dielectric is going to be prepared in accordance with the wavelength of light to be received by the APD. In one aspect, the wavelength can be 850 nanometers and the thickness can be determined so that it is an anti-reflection coating that absorbs protons. The thickness can be a multiple of a ¼ wavelength, such as ½, ¾, etc. of the wavelength. In one aspect, the dielectric can be a one-quarter lambda layer in the active region and an environmental-protection layer (e.g., passivation layer) can cover everything except the active region. Alternatively, the top environmental-protection layer can be applied to cover everything on the chip, including the active region, but its total thickness over the active region is controlled to be an odd integer multiple of the quarter wavelength.

In one embodiment, an avalanche photodiode can include: an avalanche region having one or more layers prepared from GaAs; an $N^-$ absorption layer extending across the avalanche region; a N-type layer above a center portion of the $N^-$ absorption layer or extending across a mesa region over the $N^-$ absorption layer; and optionally a lower conductivity layer laterally from the N-type layer to a surface of the avalanche region and above a perimeter portion of the $N^-$ absorption layer, the lower conductivity layer having lower conductivity compared to the N-type layer. In one aspect, the lower conductivity layer can have a conductivity-reducing implant compared to conductivity of the N-type layer. In one aspect, the implant is a proton implant or a beryllium implant. In one aspect, the avalanche photodiode can include a window layer above the N-type layer and lower conductivity layer, and an anode contact above the window layer. In one aspect, the avalanche photodiode can include an $N^+$ barrier layer below the $N^-$ absorption layer, an $N^+$ conduction layer below the $N^+$ barrier layer, and a substrate below the $N^+$ conduction layer, and a cathode contact coupled with the $N^+$ conduction layer. In one aspect, the avalanche region is included in a mesa structure, the mesa extending into the $N^+$ conduction layer so that a portion of the $N^+$ conduction layer is in the mesa and a portion forms a shoulder from the mesa, with the cathode contact on the shoulder of the $N^+$ conduction layer. In one aspect, the avalanche photodiode can include: an oxide layer above the window layer; a dielectric passivation layer coated onto the window layer and over side surfaces of the mesa; an anode bond pad coupled with the anode contact; a cathode bond pad coupled with the cathode contact; and an environmental-protection passivation layer above the dielectric passivation layer, anode contact, and cathode contact, and the environmental-protection passivation layer having openings that expose the anode bond pad and cathode bond pad.

In one embodiment, an avalanche photodiode can include: an avalanche region having one or more layers prepared from GaAs; an $N^-$ absorption layer extending across the avalanche region; a N-type layer above a center portion of the $N^-$ absorption layer or extending over the entirety thereof; and optionally a lower conductivity layer laterally from the N-type layer to a surface of the avalanche region and above a perimeter portion of the N⁻ absorption layer, the lower conductivity layer having lower conductivity compared to the N-type layer. The avalanche photodiode can include a window layer above the N-type layer and above the N⁻ absorption layer, the window layer including the lower conductivity layer, and an anode contact above the window layer. The avalanche photodiode can include an N⁺ barrier layer below the N⁻ absorption layer, an N⁺ conduction layer below the N⁺ barrier layer, a substrate below the N⁺ conduction layer, and a cathode contact coupled with the N⁺ conduction layer. The avalanche photodiode can include an avalanche region that is included in a mesa structure, the mesa extending into the N⁺ conduction layer so that a portion of the N⁺ conduction layer is in the mesa and a portion forms a shoulder from the mesa, with the cathode contact on the shoulder of the N⁺ conduction layer. In one aspect, the avalanche photodiode can include: an oxide layer above the window layer; a dielectric passivation layer coated onto the window layer and over side surfaces of the mesa; an anode bond pad coupled with the anode contact; a cathode bond pad coupled with the cathode contact; and an environmental-protection passivation layer above the dielectric passivation layer, anode contact, and cathode contact, and the environmental-protection passivation layer having openings that expose the anode bond pad and cathode bond pad.

In one embodiment, an avalanche photodiode can include: an avalanche region having one or more layers prepared from GaAs; a P⁻ absorption layer extending across the avalanche region; a P-type layer below a center portion of the P⁻ absorption layer or the P-type layer extending across the mesa and below the entirety of the P⁻ absorption layer; and optionally a lower conductivity region laterally from the P-type layer to a surface of the avalanche region and below a perimeter portion of the P⁻ absorption layer, the lower conductivity region having lower conductivity compared to the P-type layer. The avalanche photodiode can include a window layer above the P⁻ absorption, the P⁻ absorption layer including the lower conductivity region, and an anode contact above the window layer. The avalanche photodiode can include an N⁺ barrier layer below the P⁻ absorption layer, an N⁺ conduction layer below the N⁺ barrier layer, a substrate below the N⁺ conduction layer, and a cathode contact coupled with the N⁺ conduction layer. In one aspect, the avalanche region is included in a mesa structure, the mesa extending into the N⁺ conduction layer so that a portion of the N⁺ conduction layer is in the mesa and a portion forms a shoulder from the mesa, with the cathode contact on the shoulder of the N⁺ conduction layer. In one aspect, the avalanche photodiode can include: an oxide layer above the window layer; a dielectric passivation layer coated onto the window layer and over side surfaces of the mesa; an anode bond pad coupled with the anode contact; a cathode bond pad coupled with the cathode contact; and an environmental-protection passivation layer above the dielectric passivation layer, anode contact, and cathode contact, and the environmental-protection passivation layer having openings that expose the anode bond pad and cathode bond pad.

In one embodiment, a method of manufacturing an avalanche photodiode can include: growing a base epitaxial structure having a substrate, a conduction layer above the substrate, a barrier layer above the substrate, an absorption layer above the substrate, and an active layer above the absorption layer, absorption layer, and active layer having GaAs with different doping; optionally processing the active layer to remove an annular perimeter region to leave a center active region; and growing a window layer over the center active region of the active layer and over the absorption layer. In one aspect, the active layer is an N-type active layer. In one aspect, the active layer is a P-type active layer.

In one embodiment, the method includes forming the window layer to have a center stepped-up region above the center active region of the active layer compared to a perimeter stepped-down region above the absorption layer, wherein the center stepped-up region and perimeter stepped-down region include about the same thickness of material.

In one embodiment, a method of manufacturing an avalanche photodiode can include: growing a base epitaxial structure having a substrate, a conduction layer above the substrate, a barrier layer above the substrate, an absorption layer above the substrate, and an active layer above the absorption layer, absorption layer, and active layer having GaAs with different doping; optionally processing the active layer with implantation to reduce conductivity of an annular perimeter region to leave a center active region; and growing a window layer over the center active region of the active layer and over the absorption layer. In one aspect, the implantation is proton or beryllium implantation.

In one embodiment, any of the manufacture methods can include the following: forming an oxide layer over the window layer; etching the base epitaxial structure to form a mesa structure; depositing a dielectric passivation layer over the mesa; etching the dielectric passivation layer to form an anode contact area and a cathode contact area; forming an anode contact in the anode contact area; forming a cathode in the cathode contact area; forming an anode bond pad that is electronically coupled with the anode contact area; forming a cathode bond pad that is electronically coupled with the cathode contact area; depositing an environmental-protection passivation layer; and removing portions of the environmental-protection passivation layer to expose the anode bond pad and cathode bond pad.

In one embodiment, the APD can be configured so that most or all of the light coupled into the APD can be absorbed somewhere in the APD structure so that none of the received light is reflected back out of the front surface of the APD. The anti-reflection surface on the front of the APD can facilitate this process and inhibit light from being reflected back through the optical fiber.

In one embodiment, in order to achieve a desired signal bandwidth of the APD, it can be useful for most or all of the active layers between the transparent P⁺ window layer and the transparent N⁺ blocking layer (e.g., barrier layer) to be depleted so that the carriers generated by optical absorption and/or avalanche gain are moving at high velocity under the influence of the electric field in the depletion region. Increasingly higher signal bandwidth of the APD can be achieved by decreasing the total thickness of the active layers (e.g., most or all of the active layers between the transparent P⁺ window layer and the transparent N⁺ blocking layer). With a given material (e.g., GaAs) in the active layers, the absorption coefficient can be substantially constant. Thus, as the active layers are made thinner for more bandwidth, reduced amounts of the incoming light may be absorbed in the active layers. The avalanche gain can make up for the loss in quantum efficiency. However, if less of the incoming light is absorbed in the active layers, the result can be more of the incoming light is absorbed in the N⁺ conduction layer where it generates hole-electron pairs, which may be undesirable. Accordingly, one function of the N⁺ blocking layer can be to keep the minority carriers generated in the N⁺ conduction layer from diffusing into the active layers (e.g., together are the active region) and becoming a part of the signal response of the APD. As such, this function can be a reason the N⁺ barrier layer can be referred to as a blocking layer. The N⁺ barrier layer can be made transparent (e.g., no optical carrier generation) by using a material like AlGaAs that has a higher bandgap than the GaAs active layers. Since the $N^+$ barrier layer and $N^+$ conduction layer are both N-type, the higher bandgap of the $N^+$ barrier layer also serves to keep the optically generated carriers in the $N^+$ conduction layer from diffusing into the active layers where they may unfavorably decrease the signal bandwidth of the APD.

In one embodiment, the $N^+$ barrier layer can be configured to provide two purposes. First, the $N^+$ barrier layer can be transparent at the operating wavelength so that photon absorption does not generate carriers in the $N^+$ barrier layer. Second, the higher bandgap of the $N^+$ barrier layer can keep carriers generated by optical absorption in the $N^+$ conduction layer from contributing to the electrical response of the APD.

One skilled in the art will appreciate that, for this and other processes and methods disclosed herein, the functions performed in the processes and methods may be implemented in differing order. Furthermore, the outlined steps and operations are only provided as examples, and some of the steps and operations may be optional, combined into fewer steps and operations, or expanded into additional steps and operations without detracting from the essence of the disclosed embodiments.

The present disclosure is not to be limited in terms of the particular embodiments described in this application, which are intended as illustrations of various aspects. Many modifications and variations can be made without departing from its spirit and scope, as will be apparent to those skilled in the art. Functionally equivalent methods and apparatuses within the scope of the disclosure, in addition to those enumerated herein, will be apparent to those skilled in the art from the foregoing descriptions. Such modifications and variations are intended to fall within the scope of the appended claims. The present disclosure is to be limited only by the terms of the appended claims, along with the full scope of equivalents to which such claims are entitled. It is also to be understood that the terminology used herein is for the purpose of describing particular embodiments only, and is not intended to be limiting.

The invention claimed is:

1. An avalanche photodiode comprising:
   an avalanche region having one or more layers prepared from GaAs
   an $N^-$ absorption layer extending across the avalanche region;
   an N-type layer above at least a center portion of the $N^-$ absorption layer; and
   a lower conductivity layer laterally from the N-type layer to a surface of the avalanche region and above a perimeter portion of the $N^-$ absorption layer, the lower conductivity layer having lower conductivity compared to the N-type layer.

2. The avalanche photodiode of claim 1, wherein the N-type layer extends across the $N^-$ absorption layer.

3. The avalanche photodiode of claim 2, wherein the N-type layer extends across a mesa having the N-type layer and the $N^-$ absorption layer.

4. The avalanche photodiode of claim 1, wherein the lower conductivity layer having a conductivity reducing implant compared to conductivity of the N-type layer.

5. The avalanche photodiode of claim 4, wherein the implant is a proton implant or a beryllium implant.

6. The avalanche photodiode of claim 1, comprising a window layer above the N-type layer, and an anode contact above the window layer.

7. The avalanche photodiode of claim 6, comprising an $N^+$ barrier layer below the $N^-$ absorption layer, an $N^+$ conduction layer below the $N^+$ barrier layer, a substrate below the $N^+$ conduction layer, and a cathode contact coupled with the $N^+$ conduction layer.

8. The avalanche photodiode of claim 7, wherein the avalanche region is included in a mesa structure, the mesa extending into the $N^+$ conduction layer so that a portion of the $N^+$ conduction layer is in the mesa and a portion forms a shoulder from the mesa, with the cathode contact on the shoulder of the $N^+$ conduction layer.

9. The avalanche photodiode of claim 8, comprising:
   an oxide layer above the window layer;

TABLE 1

| 850 nm APD Epi Design Layer Name | Material | Target Thickness (nm) | Spec Limits Thickness (nm) | Cumulative Thickness (nm) | Target Xs (—) | Spec Limits Xs | Target n-doping (cm$^{-3}$) | Spec Limits n-doping | Target p-doping (cm$^{-3}$) | Spec Limits p-doping |
|---|---|---|---|---|---|---|---|---|---|---|
| Substrate | GaAs | 0 | — | — | 0 | — | | | | |
| Marker Layer | AlGaAs | 50 | 40-60 | 50 | 0.3 | 0.26-0.34 | | | | |
| N- Conduction Layer | GaAs | 3000 | 2700-3300 | 3050 | 0 | | 1.00E+18 | 0.8-1.2E+18 | | |
| Ramp | grade | 50 | 40-60 | 3100 | 0->0.3 | | 1.00E+18 | | | |
| Lower Cladding Layer | AlGaAs | 220 | 180-200 | 3320 | 0.3 | 0.26-0.34 | 1.00E+18 | 0.8-1.2E+18 | | |
| Ramp | grade | 50 | 45-55 | 3370 | 0.3->0 | | | | 5.00E+14 | 2.5-7.5E+14 |
| Spacer Layer | GaAs | 5 | 3-7 | 3375 | 0 | | | | 5.00E+14 | 2.5-7.5E+14 |
| N' Absorption Layer | GaAs | 1745 | 1700-1790 | 5120 | 0 | | 3.00E+14 | 1.5E+13-1.174E+15 | | |
| N-Type Layer | GaAs | 355 | 335-377 | 5475 | 0 | | 1.30E+17 | 1.22-1.38E+17 | | |
| Ramp | grade | 40 | 35-45 | 5515 | 0->0.3 | | | | 1.3E+17->1.13E+19 | |
| Upper Cladding Layer | AlGaAs | 852 | 801-903 | 6367 | 0.3 | 0.26-0.34 | | | 1.30E+19 | 1-1.6E+19 |
| Cap | GaAs | 40 | 30-50 | 6407 | 0 | | | | 6.00E+19 | 5-7E+19 | a dielectric passivation layer coated onto the window layer and over side surfaces of the mesa;

an anode bond pad coupled with the anode contact;

a cathode bond pad coupled with the cathode contact; and an environmental-protection passivation layer above the dielectric passivation layer, anode contact, and cathode contact, and the environmental-protection passivation layer having openings that expose the anode bond pad and cathode bond pad.

10. The avalanche photodiode of claim 1, comprising a window layer above the N-type layer and above the $N^-$ absorption layer, the window layer including the lower conductivity layer, and an anode contact above the window layer.

11. The avalanche photodiode of claim 10, comprising an $N^+$ barrier layer below the $N^-$ absorption layer, an $N^+$ conduction layer below the $N^+$ barrier layer, a substrate below the $N^+$ conduction layer, and a cathode contact coupled with the $N^+$ conduction layer.

12. The avalanche photodiode of claim 11, wherein the avalanche region is included in a mesa structure, the mesa extending into the $N^+$ conduction layer so that a portion of the $N^+$ conduction layer is in the mesa and a portion forms a shoulder from the mesa, with the cathode contact on the shoulder of the $N^+$ conduction layer.

13. The avalanche photodiode of claim 12, comprising:

an oxide layer above the window layer;

a dielectric passivation layer coated onto the window layer and over side surfaces of the mesa;

an anode bond pad coupled with the anode contact;

a cathode bond pad coupled with the cathode contact; and an environmental-protection passivation layer above the dielectric passivation layer, anode contact, and cathode contact, and the environmental-protection passivation layer having openings that expose the anode bond pad and cathode bond pad.

14. An avalanche photodiode comprising:

an avalanche region having one or more layers prepared from GaAs;

a $P^-$ absorption layer extending across the avalanche region;

an P-type layer below at least a center portion of the $P^-$ absorption layer; and a lower conductivity region laterally from the P-type layer to a surface of the avalanche region and below a perimeter portion of the $P^-$ absorption layer, the lower conductivity region having lower conductivity compared to the P-type layer.

15. The avalanche photodiode of claim 14, wherein the $P^-$ absorption layer extends across the P-type layer.

16. The avalanche photodiode of claim 15, wherein the P-type layer extends across a mesa having the P-type layer and the $P^-$ absorption layer.

17. The avalanche photodiode of claim 14, comprising a window layer above the $P^-$ absorption layer, the $P^-$ absorption layer including the lower conductivity region and an anode contact above the window layer.

18. The avalanche photodiode of claim 17, comprising an $N^+$ barrier layer below the $P^-$ absorption layer, an $N^+$ conduction layer below the $N^+$ barrier layer, a substrate below the $N^+$ conduction layer, and a cathode contact coupled with the $N^+$ conduction layer.

19. The avalanche photodiode of claim 18, wherein the avalanche region is included in a mesa structure, the mesa extending into the $N^+$ conduction layer so that a portion of the $N^+$ conduction layer is in the mesa and a portion forms a shoulder from the mesa, with the cathode contact on the shoulder of the $N^+$ conduction layer.

20. The avalanche photodiode of claim 19, comprising:

an oxide layer above the window layer;

a dielectric passivation layer coated onto the window layer and over side surfaces of the mesa;

an anode bond pad coupled with the anode contact;

a cathode bond pad coupled with the cathode contact; and an environmental-protection passivation layer above the dielectric passivation layer, anode contact, and cathode contact, and the environmental-protection passivation layer having openings that expose the anode bond pad and cathode bond pad.

21. An avalanche photodiode comprising:

an avalanche region having one or more layers prepared from GaAs;

an $N^-$ absorption layer extending across the avalanche region;

an N-type layer above at least a center portion of the $N^-$ absorption layer; and an $N^+$ barrier layer below the $N^-$ absorption layer, an $N^+$ conduction layer below the $N^+$ barrier layer, a substrate below the $N^+$ conduction layer, and a cathode contact coupled with the $N^+$ conduction layer.

* * * * *